United States Patent
Nihei et al.

(10) Patent No.: US 12,305,101 B2
(45) Date of Patent: May 20, 2025

(54) COMPOSITE FINE PARTICLES, SOLAR CELL, MEMBER FOR PHOTOELECTRIC CONVERSION ELEMENTS, AND PHOTOELECTRIC CONVERSION ELEMENT

(71) Applicant: JAPAN SCIENCE AND TECHNOLOGY AGENCY, Kawaguchi (JP)

(72) Inventors: Ayumi Nihei, Yokohama (JP); Tsutomu Miyasaka, Machida (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 18/681,529

(22) PCT Filed: Aug. 3, 2022

(86) PCT No.: PCT/JP2022/029739
§ 371 (c)(1),
(2) Date: Feb. 6, 2024

(87) PCT Pub. No.: WO2023/037797
PCT Pub. Date: Mar. 16, 2023

(65) Prior Publication Data
US 2024/0352314 A1 Oct. 24, 2024

(30) Foreign Application Priority Data
Sep. 10, 2021 (JP) ................. 2021-147994

(51) Int. Cl.
*C09K 11/67* (2006.01)
*C09K 11/02* (2006.01)
*H10K 30/40* (2023.01)

(52) U.S. Cl.
CPC .......... *C09K 11/671* (2013.01); *C09K 11/025* (2013.01); *H10K 30/40* (2023.02)

(58) Field of Classification Search
None
See application file for complete search history.

(56) References Cited

U.S. PATENT DOCUMENTS

| | | |
|---|---|---|
| 2011/0126889 A1 | 6/2011 | Bourke et al. |
| 2015/0280019 A1 | 10/2015 | Ohara et al. |
| | (Continued) | |

FOREIGN PATENT DOCUMENTS

| | | |
|---|---|---|
| CN | 113061434 A | 7/2021 |
| EP | 3190632 A1 | 7/2017 |
| | (Continued) | |

OTHER PUBLICATIONS

Office Action (Notice of Allowance) issued on Jul. 30, 2024, by the Japan Patent Office in corresponding Japanese Patent Application No. 2023-546833, and an English translation of the Office Action (10 pages).

(Continued)

*Primary Examiner* — Eli S Mekhlin
(74) *Attorney, Agent, or Firm* — Panitch Schwarze Belisario & Nadel LLP

(57) ABSTRACT

The composite fine particle includes an inorganic fine particle having a light wavelength conversion ability, a continuous or discontinuous first coating layer formed on the whole or a part of a surface of the inorganic fine particle, a second coating layer formed on the first coating layer, and a third coating layer formed on the second coating layer, in which the second coating layer contains a multidentate organic ligand that is an organic compound having light absorption in a near-infrared or infrared range and has at least two or more coordination sites, and the first coating (Continued)

layer is a metal layer or an inorganic compound layer containing a coordination metal and a transition metal identical to or different from the coordination metal, and the third coating layer is a metal layer or an inorganic compound layer containing a coordination metal.

11 Claims, 10 Drawing Sheets

(56) References Cited

U.S. PATENT DOCUMENTS

| 2016/0200974 A1 | 7/2016 | Smith et al. |
| 2017/0190967 A1 | 7/2017 | Dogan et al. |
| 2017/0358757 A1 | 12/2017 | Lee et al. |
| 2018/0002354 A1 | 1/2018 | Sum et al. |

FOREIGN PATENT DOCUMENTS

| JP | 2015046585 A | 3/2015 |
| JP | 2018168056 A | 11/2018 |
| JP | 2019135272 A | 8/2019 |
| KR | 10-2019-0051437 A | 5/2019 |
| WO | 2014077121 A1 | 1/2017 |

OTHER PUBLICATIONS

International Search Report (PCT/ISA/210) with English translation, mailed on Sep. 13, 2022, by the Japanese Patent Office as the International Searching Authority for International Application No. PCT/JP2022/029739. (4 pages).

Li, Ming et al., "Synthesis of PbS—$CH_3NH_3PbI_3$ core-shell nanoparticles with enhanced photoelectric properties", Journal of Alloys and Compounds, Accepted Feb. 21, 2017, vol. 706, pp. 395-400. (6 pages).

Office Action issued on Feb. 25, 2025, by the Korean Patent Office in corresponding KR Application No. 10-2024-7006659, and English translation of the Office Action (15 pages).

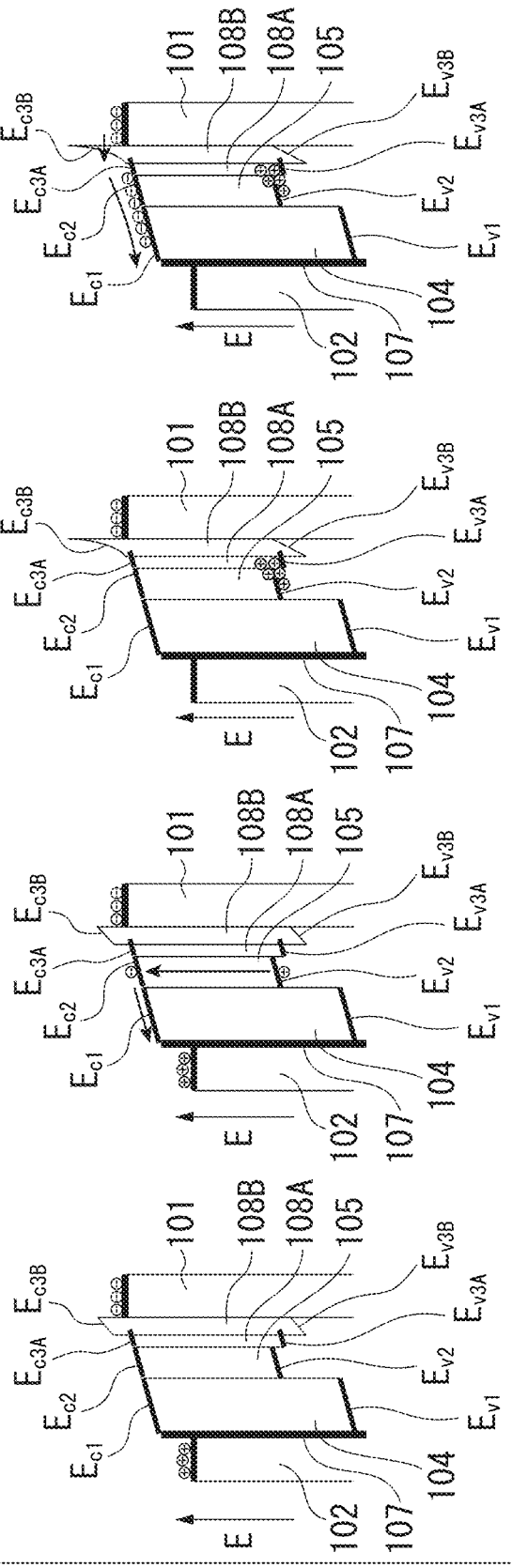

THE SECOND INTERMEDIATE PARTICLE

THE FOURTH INTERMEDIATE PARTICLE

THE FIRST INTERMEDIATE PARTICLE

THE THIRD INTERMEDIATE PARTICLE

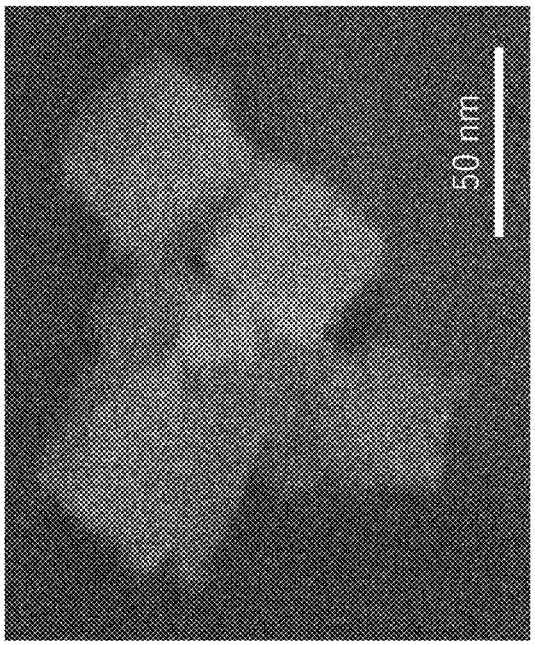
FIG. 10(b) COMPOSITE FINE PARTICLE B
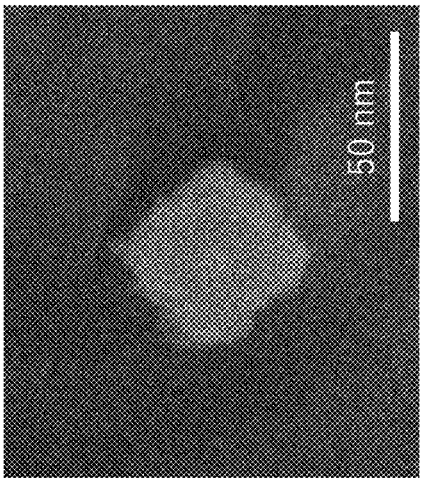
FIG. 10(a) COMPOSITE FINE PARTICLE A

COMPOSITE FINE PARTICLES, SOLAR CELL, MEMBER FOR PHOTOELECTRIC CONVERSION ELEMENTS, AND PHOTOELECTRIC CONVERSION ELEMENT

TECHNICAL FIELD

The present invention relates to a composite fine particle, a solar cell, a member for a photoelectric conversion element, and a photoelectric conversion element.

The present application claims priority based on Japanese Patent Application No. 2021-147994, filed in Japan on Sep. 10, 2021, the content of which is incorporated herein by reference.

BACKGROUND ART

Photoelectric conversion elements such as solar cells and photodiodes are widely used in various fields. However, conventional photoelectric conversion elements have a problem that detection sensitivity is lower for light in a near-infrared range than light in a visible light range. If the detection sensitivity for light in a near-infrared range can be increased as in the case of visible light, for example, in solar cells, the photoelectric conversion efficiency can be improved. Therefore, a photoelectric conversion element having high detection sensitivity as well as visible light is required for light in a near-infrared range.

As a technique for improving detection sensitivity for light in a near-infrared range, Patent Document 1 discloses a core/shell type Ln complex nanoparticle having a core/shell structure, in which the core includes a nanoparticle containing Ln, the shell includes an Ln metal layer, and further, in the shell, a ligand having a portion represented by the following formula: $-O-(A)_m-(B)_n-NH-$ (wherein A and B are the same or different and represent $-CR^1R^2$ or $-CR^3-CR^4-$, m represents 0 to 2, n represents 0 to 2, and $R^1$, $R^2$, $R^3$ and $R^4$ each independently represent a hydrogen atom or a substituent having a C, N or O atom.) is coordinated.

CITATION LIST

Patent Document

[Patent Document 1]
Japanese Unexamined Patent Application, First Publication No. 2018-168056

SUMMARY OF INVENTION

Technical Problem

Currently, a material having higher detection sensitivity than that of Patent Document 1 for light in a near-infrared range is required.

The present invention has been made in view of the above circumstances, and an object of the present invention is to provide a composite fine particle, a solar cell, a member for a photoelectric conversion element, and a photoelectric conversion element having excellent detection sensitivity for light in a near-infrared or infrared range.

Solution to Problem

In order to solve the above problems, the present invention proposes the following means.

(1) A composite fine particle according to an aspect of the present invention includes an inorganic fine particle having a light wavelength conversion ability; a continuous or discontinuous first coating layer formed on the whole or a part of a surface of the inorganic fine particle; a second coating layer formed on the first coating layer; and a third coating layer formed on the second coating layer, in which the second coating layer contains a multidentate organic ligand that is an organic compound having light absorption in a near-infrared or infrared range and has at least two or more coordination sites, and the first coating layer is a metal layer or an inorganic compound layer containing a coordination metal capable of forming a coordination bond with the multidentate organic ligand and a transition metal identical to or different from the coordination metal, and the third coating layer is a metal layer or an inorganic compound layer containing a coordination metal capable of forming a coordination bond with the multidentate organic ligand.

(2) In the composite fine particle according to (1), the inorganic fine particle may contain a metal that is a rare earth element capable of emitting excitation light in a visible or ultraviolet range.

(3) In the composite fine particle according to (2), the multidentate organic ligand may transfer energy generated by light absorption in the near-infrared or infrared range between metals to a metal that is a rare earth element capable of emitting excitation light in the visible or ultraviolet range contained in the inorganic fine particle via the transition metal contained in the first coating layer, whereby wavelength conversion light emission by the inorganic fine particle may become possible.

(4) In the composite fine particle according to any one of (1) to (3), the transition metal contained in the first coating layer may be a lanthanoid metal.

(5) In the composite fine particle according to any one of (1) to (4), the third coating layer may be an inorganic compound layer formed of an inorganic perovskite type substance.

(6) In the composite fine particle according to any one of (1) to (5), the first coating layer may be a multilayer including a metal layer or an inorganic compound layer containing the coordination metal and a metal layer or an inorganic compound layer containing a transition metal identical to or different from the coordination metal.

(7) The composite fine particle according to any one of (1) to (6) may have a substantially spherical or polygonal parallelepiped shape and an average particle size of 1 nm or more and 1 μm or less.

(8) A solar cell according to an aspect of the present invention includes a photoelectric conversion layer containing the composite fine particle according to any one of (1) to (7) and an inorganic perovskite type substance.

(9) The solar cell according to (8) may further include an electron transport layer made of titanium (IV) oxide.

(10) A member for a photoelectric conversion element according to an aspect of the present invention is obtained by laminating a layer containing the composite fine particle according to any one of (1) to (7) and a layer formed of an aggregate or a thin film containing an organic semiconductor or an inorganic semiconductor as a main component.

(11) A photoelectric conversion element according to an aspect of the present invention includes the member for a photoelectric conversion element according to (10), a hole transport layer, and an electron transport layer,
in which the member for a photoelectric conversion element is disposed between the hole transport layer and the electron transport layer.

Advantageous Effects of Invention

According to the above aspect of the present invention, it is possible to provide a composite fine particle, a solar cell, a member for a photoelectric conversion element, and a photoelectric conversion element having excellent detection sensitivity for light in a near-infrared or infrared range.

BRIEF DESCRIPTION OF DRAWINGS

FIGS. 7(a)-7(d) show structures of energy bands of respective layers during operation of the photoelectric conversion element in FIG. 6.

FIGS. 10(a) and 10(b) show SEM images of composite fine particle A and composite fine particles B.

DESCRIPTION OF EMBODIMENTS

Figure 1:
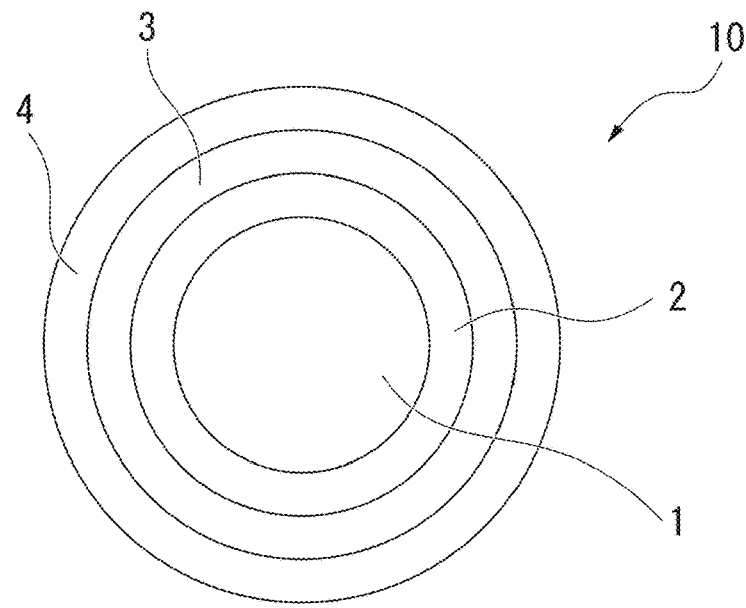
FIG. 1 is a cross-sectional view of a composite fine particle according to one embodiment of the present invention.

Hereinafter, a composite fine particle, a solar cell, a member for a photoelectric conversion element, and a photoelectric conversion element according to embodiments to which the present invention is applied will be described in detail with reference to the drawings. Here, in the drawings used in the following description, in order to facilitate understanding of features, featured parts are enlarged for convenience of illustration in some cases, and dimensional ratios of components and the like are not necessarily the same as actual ones. In addition, materials, dimensions, and the like exemplified in the following description are examples, and the present invention is not limited thereto, and can be appropriately changed and implemented without changing the gist thereof.

(Composite Fine Particle)

FIG. 1 is a cross-sectional view schematically showing a configuration of a composite fine particle 10 of the present invention. The composite fine particle 10 includes an inorganic fine particle 1 having a light wavelength conversion ability, a continuous or discontinuous first coating layer 2 formed on the whole or a part of a surface of the inorganic fine particle 1, a second coating layer 3 formed on the first coating layer 2, and a third coating layer 4 formed on the second coating layer 3.

The composite fine particle 10 has an average particle size of, for example, 1 nm or more and 1 μm or less. The composite fine particle 10 has an average particle size of preferably 1 nm or more and 100 nm or less. The composite fine particle 10 has an average particle size of more preferably 10 nm or more and 100 nm or less. The composite fine particle 10 has an average particle size of more preferably 10 nm or more and 50 nm or less. The particle size can be measured, for example, from an observation image of the composite fine particles 10 obtained by observation with a scanning electron microscope. In the observation image, the average particle size of the composite fine particles 10 may be an average value of particle sizes of arbitrarily selected ten composite fine particles 10.

The shape of the composite fine particle 10 is not particularly limited, and is, for example, a substantially spherical shape, polygonal parallelepiped shape, a scale shape, or a needle shape. The shape of the composite fine particle 10 is particularly preferably a substantially spherical or a polygonal parallelepiped shape.

"Inorganic Fine Particle"

The inorganic fine particle 1 has a light wavelength conversion ability. Here, the light wavelength conversion ability means an ability to convert a wavelength of incident light and emit light having a wavelength different from that of incident light. In the present embodiment, a case in which light in a near-infrared or infrared range whose wavelength is converted is emitted as visible light will be described as an example.

Examples of main materials of the inorganic fine particle 1 include metals that are rare earth elements capable of emitting excitation light in a visible or ultraviolet range, such as erbium (Er), thulium (Tm), ytterbium (Yb), neodymium (Nd), holmium (Ho), praseodymium (Pr), gadolinium (Gd), europium (Eu), terbium (Tb), samarium (Sm), cerium (Ce), promethium (Pm), and dysprosium (Dy), or something containing at least one compound thereof. The light in the visible or ultraviolet range refers to light having a wavelength of less than 700 nm. The material of the inorganic fine particle 1 is preferably lanthanoid metal among rare earth elements. Examples of the inorganic fine particles 1 include inorganic fine particles of $NaErF_4$, $Tm_2O_3$, $TmCl_3$, $TmF_3$, $Er_2O_3$, $ErCl_3$, $ErF_3$, $Ho_2O_3$, $HoCl_3$, $HoF_3$, and the like. The inorganic fine particle 1 may be a fine particle doped with a sensitizer (for example, $Yb^{3+}$) and a light emitter (for example, $Er^{3+}$, $Ho^{3+}$, $Tm^{3+}$) as guests. Such fine particles include inorganic fine particles such as Yb, Er-doped $Gd_2O_2S(Gd_2O_2S$: Er, Yb), $Yb^{3+}$, $Er^{3+}$-doped $NaYF_4$ ($NaYF_4$: Er, Yb), Tm, and Yb-doped $NaYF_4$ ($NaYF_4$: Tm, Yb).

The inorganic fine particle 1 has an average particle size of, for example, 1 nm to 1 μm. The inorganic fine particle 1 has an average particle size of preferably 1 nm to 100 nm. The inorganic fine particle 1 has an average particle size of more preferably 10 nm to 100 nm. The inorganic fine particle 1 has an average particle size of more preferably 10 nm to 50 nm.

The shape of the inorganic fine particle 1 is not particularly limited, and is, for example, a substantially spherical shape, a polygonal parallelepiped shape, a scale shape, or a needle shape. The shape of the inorganic fine particle 1 is particularly preferably a substantially spherical or a polygonal parallelepiped shape.

"First Coating Layer"

The first coating layer 2 is a continuous or discontinuous layer formed on the whole or a part of a surface of the inorganic fine particle 1. An example of the continuous first coating layer 2 is a case where the first coating layer 2 is laminated on the entire surface of the inorganic fine particle 1. In the case of the continuous first coating layer 2, there is an interface between the inorganic fine particle 1 and the first coating layer 2. An example of the discontinuous first coating layer 2 is an example in which a component of the inorganic fine particle 1 and a component of the first coating layer 2 are partially mixed (admixed). In the case of the discontinuous first coating layer 2, there is a mixed range having no clear interface between the inorganic fine particle 1 and the first coating layer 2.

The first coating layer 2 is a metal layer or an inorganic compound layer containing a coordination metal that can form a coordination bond with a multidentate organic ligand of the second coating layer 3 and a transition metal identical to or different from the coordination metal. Here, the coordination metal refers to a metal that can form a coordination bond with the multidentate organic ligand.

The coordination metal is not particularly limited as long as it can form a coordination bond with the multidentate organic ligand of the second coating layer 3. Examples of the coordination metal include transition metals. The coordination metal is more preferably a metal which is a rare earth element. The coordination metal is more preferably a lanthanoid metal (Ln) such as Ce, Pr, Nd, Sm, Dy, Ho, Er, Tm, or Yb. When the first coating layer 2 contains a coordination metal, a coordination bond is formed between the multidentate organic ligand of the second coating layer 3 and the first coating layer 2. As a result, energy transfer from the multidentate organic ligand in the second coating layer 3 can be efficiently promoted.

The first coating layer 2 contains a transition metal identical to or different from the coordination metal. Energy generated by light absorption in the second coating layer 3 is transferred between metals to the inorganic fine particle 1 via the transition metal in the first coating layer 2. The transition metal of the first coating layer 2 is a metal that mediates energy transfer (energy-mediating metal). The energy-mediating metal of the first coating layer 2 is preferably a metal which is a rare earth element. The energy-mediating metal of the first coating layer 2 is more preferably a lanthanoid metal (Ln) such as Ce, Pr, Nd, Sm, Dy, Ho, Er, Tm, or Yb.

The first coating layer 2 is a metal layer or an inorganic compound layer containing a coordination metal and a transition metal (energy-mediating metal). When the first coating layer 2 is an inorganic compound layer, examples thereof include $NaYbF_4$, $NaNdF_4$, $Yb(NO_3)_3$, $Yb(CH_3COO)_3$, $Yb(CF_3SO_3)_3$, $Yb_2(SO_4)_3$, $Yb_2(CO_3)_3$, $YbCl_3$, $YbBr_3$, $YbI_3$, $Er_2O_3$, and the like.

The thickness of the first coating layer 2 is not particularly limited, but may be 5% or more of the particle size of the inorganic fine particle 1, and is preferably substantially uniform over the surface of the inorganic fine particle 1. The thickness of the first coating layer 2 is, for example, 1 to 10 nm. More preferably, the thickness of the first coating layer 2 is 1 to 5 nm. The coverage of the first coating layer 2 on the surface of the inorganic fine particle 1 is preferably 50% or more. In the inorganic fine particle 1, the coverage of the first coating layer 2 is more preferably 100%.

"Second Coating Layer"

The second coating layer 3 is provided on the first coating layer 2. The second coating layer 3 contains a multidentate organic ligand that is an organic compound having light absorption in a near-infrared or infrared range and has at least two or more coordination sites. The near-infrared or infrared range refers to, for example, a wavelength range of 700 nm to 3,000 nm. The multidentate organic ligand of the second coating layer 3 is an organic compound having a high absorption coefficient in the near-infrared or infrared range. The multidentate organic ligand of the second coating layer 3 forms a coordination bond with the first coating layer 2, so that the energy absorbed by the multidentate organic ligand can be efficiently transferred to the inorganic fine particle 1 through the energy-mediating metal of the inorganic fine particle 1. When energy transfers to a rare earth element capable of emitting excitation light in a visible or ultraviolet range contained in the inorganic fine particle 1, light having a wavelength different from that of incident light can be emitted.

That is, the multidentate organic ligand transfers energy generated by light absorption in the near-infrared or infrared range between metals to a metal that is a rare earth element capable of emitting excitation light in the visible or ultraviolet range contained in the inorganic fine particle 1 via the transition metal (energy-mediating metal) contained in the first coating layer 2, whereby wavelength conversion light emission by the composite fine particle 10 becomes possible.

The multidentate organic ligand is not particularly limited as long as it has light absorption in the near-infrared or infrared range and has two or more coordination sites. Specific examples thereof include a bidentate ligand having two coordination sites, a tetradentate ligand having four coordination sites, a hexadentate ligand having six coordination sites, and the like.

Examples of representative multidentate organic ligands include indocyanine dyes, quinone (quinoid) dyes, squarylium dyes, cyanine dyes, phthalocyanine dyes, porphyrin dyes, azo compounds, coumarin dyes, indoline dyes, eosin, fluorescein, rhodamine, merocyanine, coumarin, indoline, and the like as the ligand compound. An example of preferred multidentate organic ligands includes an indocyanine dye represented by the following formula (1) and a derivative thereof, an indigo dye represented by the following formula (2) and a derivative thereof (here, examples of R in the formula include a sulfonic acid group and the like.), and a squarylium dye represented by the following formula (3) and a derivative thereof (examples of R in the formula include an alkyl group, an alkyl group that forms a ring together with an atom on an adjacent aromatic ring, and the like.).

The indocyanine dyes and derivatives thereof are compounds having a hexatriene basic skeleton, and examples of representative compounds include indocyanine green (ICG) and the like. In addition, the indigo dye and a derivative thereof are compounds having a bi (2,3-dihydroxy-3-oxoindolylidene) basic skeleton, and examples of representative compounds include indigo carmine and the like. In addition, the squarylium dye and the derivative thereof are compounds having a squaric acid skeleton in the central part of the molecule and having a basic skeleton having substituents composed of an aromatic compound at two carbon atoms located diagonally, and representative compounds include 2,4-bis [4-(diethylamino)-2-hydroxyphenyl]squaraine, 2,4-bis [8-hydroxy-1,1,7,7-tetramethyldurolidin-9-yl]squaraine, and the like.

[Chemical Formula 1]

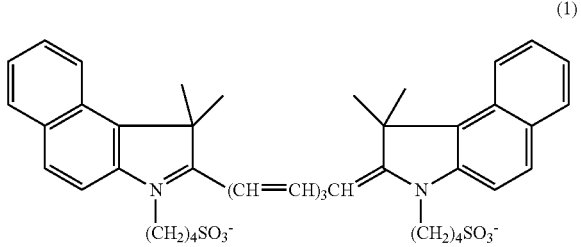

(1)

[Chemical Formula 2]

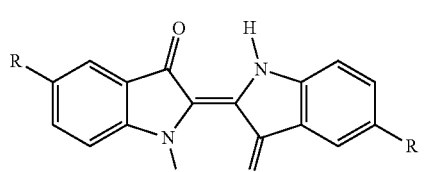

(2)

[Chemical Formula 3]

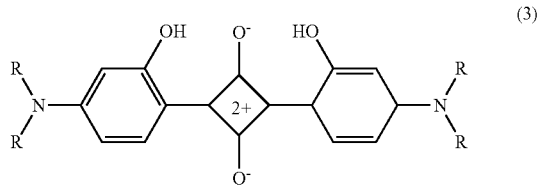

(3)

The thickness of the second coating layer 3 is not particularly limited as long as it can absorb incident light. The thickness of the second coating layer 3 is, for example, not less than a thickness of a monomolecular film. Preferably, it is substantially a monomolecular film.

"Third Coating Layer"

The third coating layer 4 is provided on the second coating layer 3. The third coating layer 4 is a metal layer or an inorganic compound layer containing a coordination metal that can form a coordination bond with the multidentate organic ligand of the second coating layer 3. Since the third coating layer 4 contains a coordination metal, a coordination bond is formed with the multidentate organic ligand of the second coating layer 3. Similarly, a coordination bond is formed between the first coating layer 2 and the multidentate organic ligand of the second coating layer 3. As a result, the multidentate organic ligand of the second coating layer 3 is firmly bound between the first coating layer 2 and the second coating layer 3. When an organic molecule is present in the composite fine particle, light emission is dissipated through thermal vibration of the organic molecule. In the composite fine particle 10, the multidentate organic ligand is firmly bound, so that thermal vibration of the multidentate organic ligand is suppressed. As a result, the conversion efficiency of the composite fine particle 10 can be improved.

The coordination metal of the third coating layer 4 is not particularly limited as long as it can form a coordination bond with the multidentate organic ligand of the second coating layer 3. Examples of the coordination metal include transition metals. The coordination metal is more preferably a metal which is a rare earth element. The coordination metal is more preferably a lanthanoid metal (Ln) such as Ce, Pr, Nd, Sm, Dy, Ho, Er, Tm, or Yb.

When the third coating layer 4 is used for a photoelectric conversion layer of a solar cell, the third coating layer 4 is preferably an inorganic compound layer formed of an inorganic perovskite type substance. By using the inorganic perovskite type substance, the affinity with the photoelectric conversion layer is improved, and the photoelectric conversion efficiency is improved. Examples of materials of inorganic perovskite type substances constituting the third coating layer 4 include a composite composed of three kinds of inorganic elements, for example, $CsPbX_3(X=Cl^-, Br^-, I^-)$ and the like. X includes at least one of halogen ions. For example, when $ErYF_4$ or Er, Yb-doped $NaYF_4$ ($NaYF_4$: Er, Yb) is used as the inorganic fine particle 1, it is preferable to use $C_3PbBr_3$ or $CsPbI_3$ because the photoelectric conversion efficiency is improved. When Tm, Yb-doped $NaYF_4$ ($NaYF_4$: Tm, Yb) is used, it is preferable to use $CsPbCl_3$ because the photoelectric conversion efficiency is improved thereby.

The thickness of the third coating layer 4 is not particularly limited, and may be 5% or more of the particle size of the inorganic fine particle 1, and is preferably substantially uniform over the surface of the second coating layer 3. The thickness of the third coating layer 4 is, for example, 1 to 10 nm. More preferably, the thickness of the third coating layer 4 is 1 to 5 nm. The coverage of the third coating layer 4 on the surface of the second coating layer 3 is preferably 50% or more. More preferably, the coverage of the third coating layer 4 on the surface of the second coating layer 3 is 90% or more. In the inorganic fine particle 1, the coverage of the second coating layer 3 may be 100%.

Modified Example of Composite Fine Particle

Figure 2:
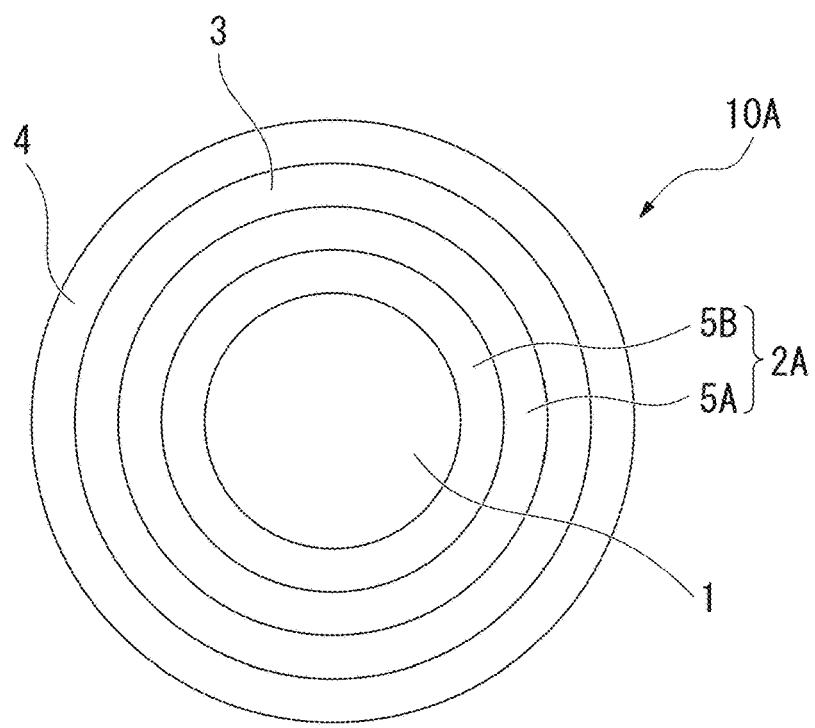
FIG. 2 is a cross-sectional view of a composite fine particle according to a modified example of the present invention.

Next, a modified example of the composite fine particle will be described with reference to FIG. 2. In this modified example, the same components as those in the composite fine particle 10 will be denoted by the same reference signs, the description of the components will be omitted, and only different points will be described. The composite fine particle 10A includes an inorganic fine particle 1 having a light wavelength conversion ability, a continuous or discontinuous first coating layer 2A formed on the whole or a part of a surface of the inorganic fine particle 1, a second coating layer 3 formed on the first coating layer 2A, and a third coating layer 4 formed on the second coating layer "First Coating Layer"

The first coating layer 2A is a continuous or discontinuous layer formed on the whole or a part of a surface of the inorganic fine particle 1. The first coating layer 2A is a multilayer including a coordination metal-containing layer 5A containing a coordination metal and an energy-mediating metal-containing layer 5B containing a transition metal identical to or different from the coordination metal of the coordination metal-containing layer 5A. The energy-mediating metal-containing layer 5B is formed on the surface of the inorganic fine particle 1, and the coordination metal-containing layer 5A is formed on the energy-mediating metal-containing layer 5B. For example, when an indocyanine dye is used, it is preferable that Nd is contained as a coordination metal in the coordination metal-containing layer 5A, and Yb is contained as an energy-mediating metal in the energy-mediating metal-containing layer 5B. For example, energy transfer from Nd to emitter metals Er and Tm is inefficient, but such a layer composition can make energy transfer more efficient.

The coordination metal-containing layer 5A is a metal layer or an inorganic compound layer containing a coordination metal that can form a coordination bond with the multidentate organic ligand of the second coating layer 3. The coordination metal contained in the coordination metal-containing layer 5A is not particularly limited as long as it can form a coordination bond with the multidentate organic ligand of the second coating layer 3. Examples of the coordination metal include transition metals. The coordination metal is more preferably a metal which is a rare earth element. The coordination metal is more preferably a lanthanoid metal such as Ce, Pr, Nd, Sm, Dy, Ho, Er, Tm, or Yb. When the coordination metal-containing layer 5A contains a coordination metal, a coordination bond is formed between the multidentate organic ligand of the second coating layer 3 and the coordination metal-containing layer 5A.

Examples of the coordination metal-containing layer 5A include $NaYbF_4$, $NaNdF_4$, $Yb(NO_3)_3$, $Yb(CH_3COO)_3$, $Yb(CF_3SO_3)_3$, $Yb_2(SO_4)_3$, $Yb_2(CO_3)_3$, $YbCl_3$, $YbBr_3$, $YbI_3$, $Er_2O_3$, and the like.

The energy-mediating metal-containing layer 5B is a metal layer or an inorganic compound layer containing a transition metal identical to or different from the coordination metal of the coordination metal-containing layer 5A. The energy-mediating metal-containing layer 5B contains a transition metal identical to or different from the coordination metal. Energy generated by light absorption in the second coating layer 3 is transferred between metals to the inorganic fine particle 1 via the transition metal in the energy-mediating metal-containing layer 5B. The transition metal of the energy-mediating metal-containing layer 5B is a metal that mediates energy transfer (energy-mediating metal). The transition metal of the energy-mediating metal-containing layer 5B is preferably a metal which is a rare earth element. More preferably, the transition metal is a lanthanoid metal (Ln) such as Ce, Pr, Nd, Sm, Dy, Ho, Er, Tm, or Yb.

Examples of the energy-mediating metal-containing layer 5B include $NaYbF_4$, $NaNdF_4$, $Yb(NO_3)_3$, $Yb(CH_3COO)_3$, $Yb(CF_3SO_3)_3$, $Yb_2(SO_4)_3$, $Yb_2(CO_3)_3$, $YbCl_3$, $YbBr_3$, $YbI_3$, $Er_2O_3$, and the like.

The thickness of the first coating layer 2A is not particularly limited, but may be 5% or more of the particle size of the inorganic fine particle 1, and is preferably substantially uniform over the surface of the inorganic fine particle 1. The thickness of the first coating layer 2A is, for example, 1 to 10 nm. More preferably, the thickness of the first coating layer 2A is 1 to 5 nm. The thickness of the coordination metal-containing layer 5A and the thickness of the energy-mediating metal-containing layer 5B can be appropriately set so as to be the thickness of the first coating layer 2A. The coverage of the first coating layer 2A on the surface of the inorganic fine particle 1 is preferably 50% or more. In the inorganic fine particle 1, the coverage of the first coating layer 2A is more preferably 100%.

(Photoelectric Conversion Element)

Figure 3:
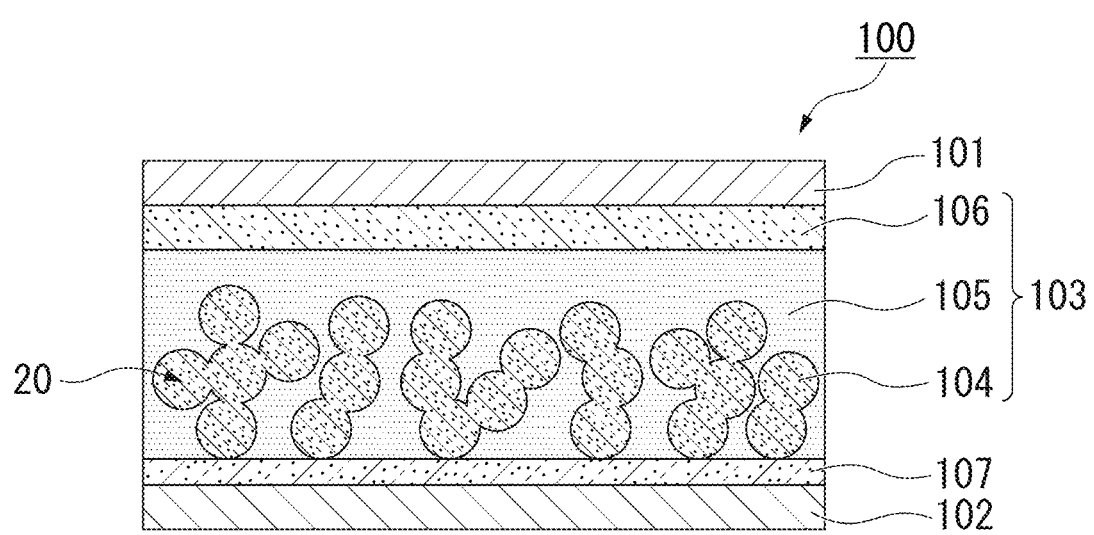
FIG. 3 is a cross-sectional view of a photoelectric conversion element including the composite fine particle in FIG. 1.

FIG. 3 is a cross-sectional view of a photoelectric conversion element 100 including the composite fine particle 10. The photoelectric conversion element 100 is a photoelectric conversion element suitable for a solar cell. The photoelectric conversion element 100 is mainly composed of a positive electrode layer (positive electrode member) 101, a negative electrode layer (negative electrode member) 102, and a photoelectric conversion layer 103 interposed therebetween.

A buffer layer 107 may be interposed between the negative electrode layer 102 and the photoelectric conversion layer 103, in which $E_{cb}$ as an energy level in a conduction band is present between $E_{c2}$ and $E_{c3}$ as energy levels of the negative electrode layer 102 and the photoelectric conversion layer 103 (that is, $E_{c2}<E_{cb}<E_{c3}$). Examples of materials constituting the buffer layer 107 include europium oxide ($Eu_2O_3$), titanium oxide, tin oxide, and the like. Examples of the structure of the buffer layer 107 include a structure in which one or more kinds of the constituent materials are laminated on the surface of the photoelectric conversion layer 103 on the negative electrode layer 102 side.

In order to allow the photoelectric conversion layer 103 to receive light, the negative electrode layer 102 may be formed of a material having light transmitting properties, for example, antimony-doped tin oxide (ATO), indium tin oxide (ITO), zinc oxide, tin oxide, fluorine-doped tin oxide (FTO), or the like. In the process of producing the photoelectric conversion layer 103 of the present embodiment, it is necessary to perform heat treatment. Therefore, as the material of the negative electrode layer 102, ATO having heat resistance is preferable among the above materials.

The positive electrode layer 101 does not have to be transparent, and a metal, a conductive polymer or the like can be used as the electrode material of the electrode. Specific examples of electrode materials include metals such as gold (Au), silver (Ag), aluminum (Al), and zinc (Zn), an alloy of two or more among the metals, graphite, graphite interlayer compounds, polyanilines and derivatives thereof, polythiophene and derivatives thereof. Examples of materials of the transparent positive electrode layer 101 include ITO.

As shown in FIG. 3, mainly, the photoelectric conversion layer 103 may be a laminate including a first layer (electron transport layer) 104 composed of a plurality of particles 20 including an inorganic semiconductor as a main component (hereinafter referred to as "inorganic semiconductor particles"), a second layer 105 which is formed on the surface of the first layer 104, and is composed of an aggregate or a thin film (composite) including an inorganic perovskite type substance as a main component, and additionally including the composite fine particle 10, and a third layer 106 composed of a plurality of particles including an organic or an inorganic semiconductor (including a metal complex) as a main component or an aggregate thereof, or a thin film including the organic or the inorganic semiconductor (including a metal complex) as a main component. That is, the photoelectric conversion element 100 may have a configuration in which the positive electrode layer 101, the third layer 106, the second layer 105, the first layer 104, and the negative electrode layer 102 are arranged in that order, and at least a current path is formed from the positive electrode layer 101 to the negative electrode layer 102. The photoelectric conversion layer 103 contains the composite fine particle 10 and the inorganic perovskite type substance. Here, "including an inorganic semiconductor as a main component" means that, in inorganic semiconductor particles 20, the inorganic semiconductor is contained in an amount in which functions of the present invention can be exhibited, and specifically, for example, the amount of the inorganic semiconductor is more than 50 volume % with respect to the total volume of the first layer 104. The amount is preferably more than 90 volume %, and more preferably, the main component is composed of a substantially inorganic semiconductor. "Including an inorganic perovskite type substance as a main component" means that the inorganic perovskite type substance is contained in an amount in which functions of the present invention can be exhibited with respect to the total volume of the second layer 105, and specifically, for example, the amount of the inorganic perovskite type substance is more than 50 volume % with respect to the total volume of the second layer 105. The amount thereof is preferably 70 volume % or more. In addition, "including an organic or an inorganic semiconductor (including a metal complex) as a main component" means that the aggregate or thin film (composite) containing the composite fine particle 10 is contained in an amount in which functions of the present invention can be exhibited with respect to the total volume of the third layer 106, and specifically, for example, the amount of the organic or inorganic semiconductor is more than 50 volume % with respect to the total volume of the third layer 106. The amount thereof is preferably more than 90 volume %, and more preferably, the main component is composed of a substantially organic or inorganic semiconductor (including a metal complex). A larger number of current paths to be formed is more preferable, but adjacent current paths may or may not be electrically connected to each other. Here, "layer" in the present embodiment refers to a film that is formed by performing a film formation process once or multiple times, and the film is not limited to being flat and is not necessarily an integrated film.

Furthermore, materials and compositions of the three layers 104 to 106 are determined such that energy levels in the conduction band (LUMO, excited state) increase in order of the first layer 104, the second layer 105, and the third layer 106. For example, in the first layer 104, the energy level in the valence band can be set to −8 eV or higher, and the energy level in the conduction band can be set to −4 eV or lower. In this case, in the second layer 105, the energy level in the valence band can be set to −6.0 eV or higher, and the energy level in the conduction band can be set to −3 eV or lower. In addition, in the third layer 106, the energy level in the conduction band is preferably −2 eV or lower.

The first layer 104 is an aggregate of a plurality of inorganic semiconductor particles 20 formed on the negative electrode layer 102 and is a porous film including a plurality of voids between the inorganic semiconductor particles 20. The inorganic semiconductor particle 20 in contact with the second layer 105 comes into direct contact with the negative electrode layer 102 or comes into indirect contact with the negative electrode layer 102 via another inorganic semiconductor particle 20 so that it is electrically connected to the negative electrode layer 102. The presence of the first layer 104 which is a porous film can increase the contact area with the second layer 105.

As the inorganic semiconductor contained in the inorganic semiconductor particle 20, one having an absorption wavelength in the ultraviolet light range is preferable, and examples thereof include titanium (IV) oxide, zinc oxide, and the like. The inorganic semiconductor particle 20 is, for example, titanium (IV) oxide. In this case, the photoelectric conversion element 100 includes an electron transport layer made of titanium (IV) oxide. The thickness of the first layer 104 is preferably about 10 nm or more and 1,000 nm or less and more preferably about 50 nm or more and 500 nm or less. In the case of application to a solar cell, the first layer 104 may not be formed.

In the production step, the second layer 105 is a thin film that covers an exposed portion on the surface of the inorganic semiconductor particle 20, that is, a portion that is not in contact with the negative electrode layer 102 and the inorganic semiconductor particle 20. The second layer 105 does not need to cover the entire exposed portion, but should cover at least the side of the positive electrode layer 101 in order to form the current path.

The inorganic perovskite type substance constituting the second layer 105 is composed of a plurality of molecules including metal cations such as $Pb^{2+}$ and $Sn^{2+}$, halogenated anions such as $I^-$, $Cl^-$, and $Br^-$, and organic cations such as $CH_3NH_3^+$ (MA), $NH=CHNH_2^+$ (FA), and $C_s^+$. The size and shape of the band gap can be changed depending on the number of ions selected from among metal cations, halide anions, and organic cations. When tin is added to the inorganic perovskite type substance, the band gap is narrowed, and the inorganic perovskite type substance responds to long-wavelength light such as near-infrared light, but oxidation easily occurs in the atmosphere and characteristics deteriorate. For respective molecules constituting the inorganic perovskite type substance, the halogenated anion is disposed at a vertex of a regular octahedron around a metal ion, and the organic cation is disposed in the vicinity of a cube containing a regular octahedron, centered on metal ions. Specifically, a regular octahedron formed of metal ions and halogenated anions forms a three-dimensional lattice, and organic cations enter gaps thereof in the structure.

When the third coating layer 4 of the composite fine particle 10 is an inorganic compound layer formed of an inorganic perovskite type substance, a boundary between the third coating layer 4 and the inorganic perovskite type substance in the composite fine particle 10 is substantially eliminated when the second layer 105 is formed while being in contact with the inorganic perovskite type substance constituting the second layer 105. Therefore, light converted into visible light in the composite fine particle 10 is efficiently absorbed by the inorganic perovskite type substance including the third coating layer 4. As a result, the conversion efficiency of light in a near-infrared range of the photoelectric conversion element 100 can be improved.

When a proportion of the composite fine particle 10 in the second layer 105 is 5 wt % or more with respect to the total mass of the second layer 105, the sensitivity to light in the near-infrared range is improved, which is preferable. When the proportion of the composite fine particle 10 in the second layer 105 is more than 30 wt %, it is difficult to form a perovskite type substance, and therefore 30 wt % or less is preferable.

Also, preferably, the energy level of the valence band of the second layer 105 is lower than the energy level of the valence band of the third layer 106 and is intermittently connected to the same energy level. Examples of the composition of the second layer 105 (inorganic perovskite type substance) satisfying these conditions include $CH_3NH_3PbI_3$, $NH=CHNH_2PbI_3$, $CsPbI_3$, and the like. In addition, examples thereof include those in which a composition ratio of I and Cl or Br among halide anions is changed.

The third layer 106 may be a thin film that covers a surface (exposed surface) of the inorganic perovskite type substance contained in the second layer within a photoelectric conversion element precursor including the first layer 104 and the second layer 105. The third layer 106 is formed of any of a p-type organic semiconductor, an inorganic semiconductor, and an organometallic complex. The thickness of the third layer 106 is preferably, for example, 1 nm or more and 100 nm or less.

Examples of the p-type organic semiconductor constituting the third layer include bathocuproine (BCP), 2,2',7,7'-tetrakis(N,N'-di-p-methoxyphenylamine)-9,9'-spirobifluorene (Spiro-OMeTAD), poly(3,4-ethylenedioxythiophene):poly(styrenesulfonate) (PEDOT: PSS), N,N,N',N'-tetrakis (4-methoxyphenyl)-benzidine (TPD), and the like.

Examples of the p-type inorganic semiconductor constituting the third layer 106 include CuI, CuSCN, and the like.

The member for a photoelectric conversion element of the present disclosure is formed by laminating the second layer 105 containing the composite fine particle 10 and the third layer 106 formed of an aggregate or a thin film containing an organic semiconductor or an inorganic semiconductor as a main component. A photoelectric conversion element including the member for a photoelectric conversion element of the present disclosure may include a hole transport layer and an electron transport layer, and the member for a photoelectric conversion element of the present disclosure may be disposed between the hole transport layer and the electron transport layer.

(Energy Band Structure)

Figure 4A:
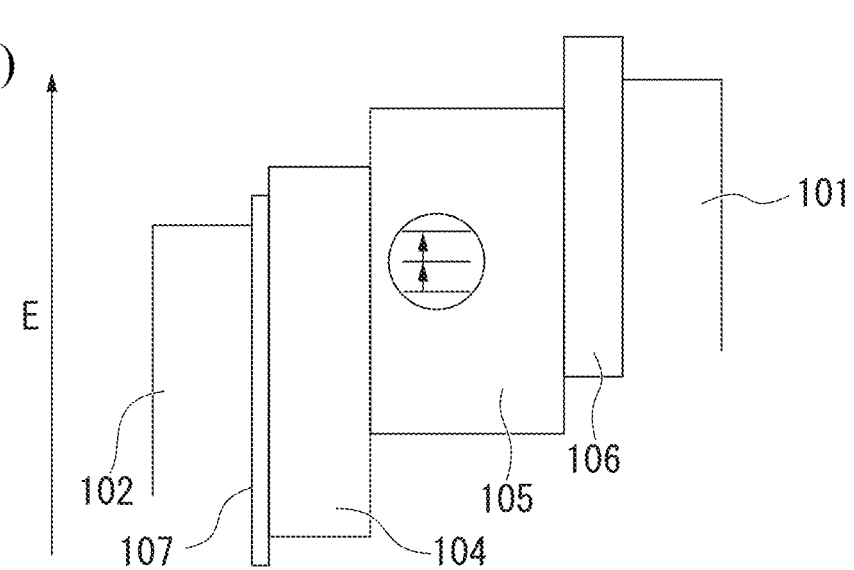
FIGS. 4(a)-4(c) show a structure of an energy band of each layer during operation of the photoelectric conversion element in FIG. 3.
Figure 4B:
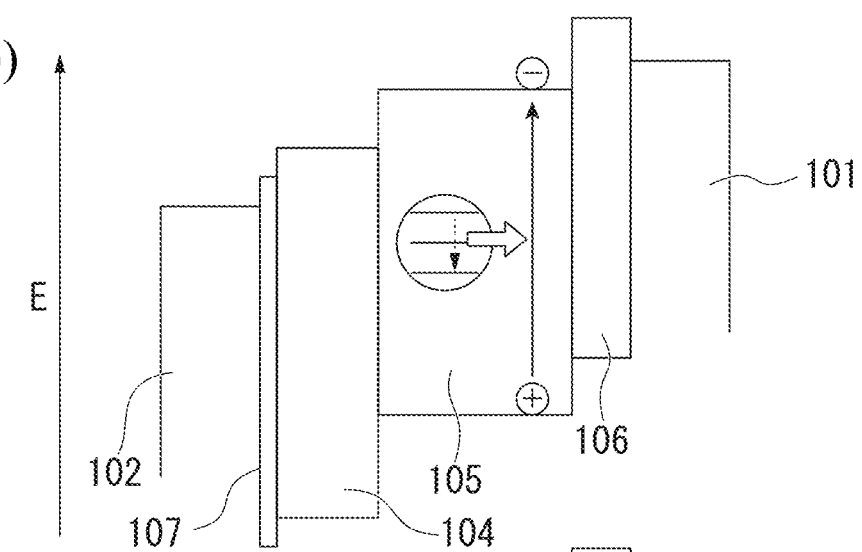
Figure 4C:
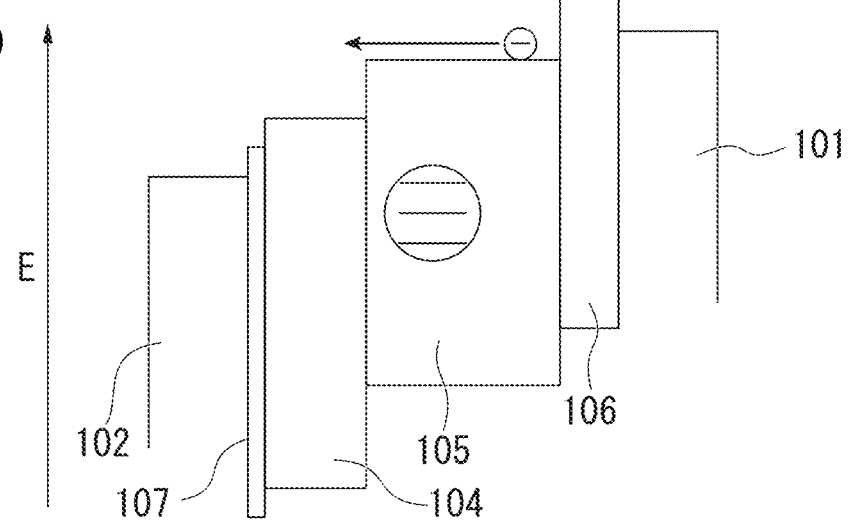

FIGS. 4(a) to 4(c) show structures of energy bands of respective layers during an operation of the photoelectric conversion element 100 according to the present embodiment.

When light is not emitted, the energy level of the third layer 106 in the conduction band is higher than the Fermi level of the positive electrode layer 101 on the side of the positive electrode layer 101, and as shown in FIG. 4(a), a current from the positive electrode layer 101 to the negative electrode layer 102 is blocked.

When light having a wavelength of 700 nm or more is emitted to the photoelectric conversion element, the composite fine particle 10 constituting the second layer 105 absorbs the light and converts the wavelength into a visible light wavelength. The inorganic perovskite type substance absorbs the light whose wavelength has been converted (FIG. 4(b)). Here, in FIG. 4(b), the broken line arrow and the solid line arrow in the composite fine particle 10 indicate the same degree of energy. The inorganic perovskite type substance generates electrons e and holes h by absorbing light, and the electrons e transition to the conduction band $E_{c1}$ (energy level in the conduction band of the first layer 104) and the holes h transition to the valence band $E_{v3}$ (energy level in the valence band of the third layer 106) (FIG. 4(c)).

Figure 5:
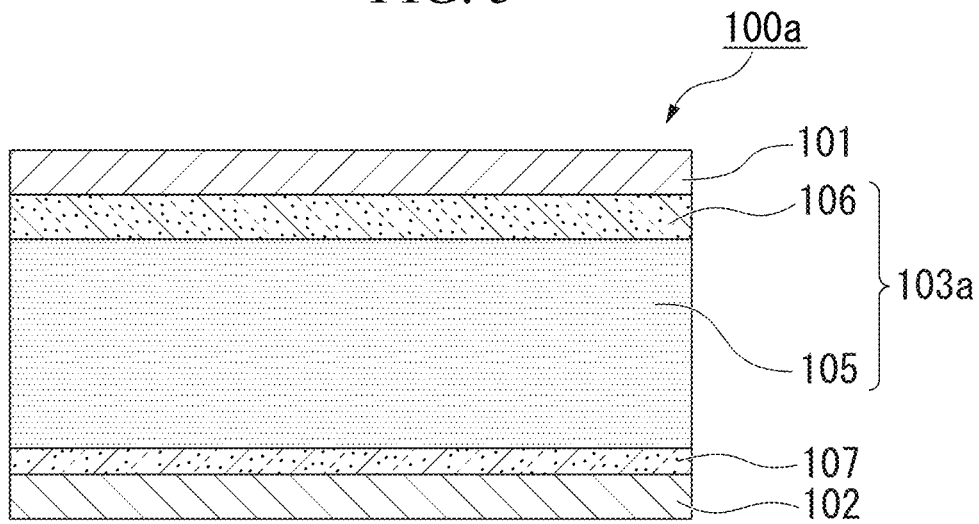
FIG. 5 is a cross-sectional view of a modified example of the photoelectric conversion element including the composite fine particle in FIG. 1.

In the above example, the case where the first layer 104a is a porous film has been described as an example, but the photoelectric conversion element is not limited to this configuration. FIG. 5 is a cross-sectional view of a modified example of the photoelectric conversion element including the composite fine particle of FIG. 1. A photoelectric conversion element 100a is composed of a positive electrode layer (positive electrode member) 101, a negative electrode layer (negative electrode member) 102, and a photoelectric conversion layer 103a interposed therebetween. The photoelectric conversion layer 103a is composed of a layered second layer 105 and a layered third layer 106. As in the photoelectric conversion element 100a, the second layer 105 and the third layer 106 may be formed in a uniform film.

Modified Example of Photoelectric Conversion Element

Figure 6:
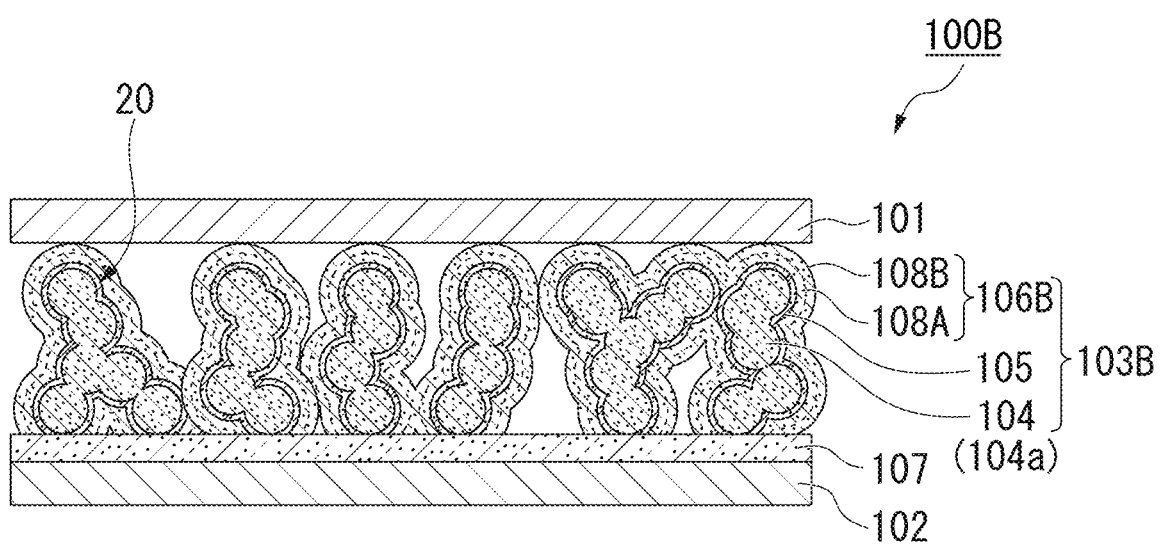
FIG. 6 is a cross-sectional view of a modified example of the photoelectric conversion element including the composite fine particle in FIG. 1.

Next, a photoelectric conversion element 100B as a modified example of the photoelectric conversion element will be described with reference to FIG. 6. The photoelectric conversion element 100B is a photoelectric conversion element having a configuration suitable for photosensor application. FIG. 6 is a cross-sectional view of a photoelectric conversion element 100B including the composite fine particle 10. The photoelectric conversion element 100B is mainly composed of a positive electrode layer (positive electrode member) 101, a negative electrode layer (negative electrode member) 102, and a photoelectric conversion layer 103B interposed therebetween. Hereinafter, similar components will be distinguished by different letters appended to the same sign. However, the description of the same components will be omitted. In addition, among similar components, when components have substantially the same functional configuration as the components that have described, the description of the components will be omitted.

The photoelectric conversion layer 103B includes a first layer 104, a second layer 105, and a third layer 106B. As shown in FIG. 6, mainly, the photoelectric conversion layer 103 may be a laminate including the first layer (electron transport layer) 104 composed of a plurality of particles 20 including an inorganic semiconductor as a main component, the second layer 105 which is formed on the surface of the first layer 104, and is composed of an aggregate or a thin film (composite) including an inorganic perovskite type substance as a main component, and additionally including the composite fine particle 10, and the third layer 106B composed of a plurality of particles including an organometallic complex as a main component or an aggregate thereof, or a thin film including the organometallic complex as a main component. Here, "including an organometallic complex as a main component" means that, in particles or an aggregate thereof, or a thin film, the amount of the organometallic complex is more than 50 volume % with respect to the total volume of the third layer. The amount thereof is preferably more than 90 volume %, and more preferably, the main component is composed of a substantially inorganic semiconductor. That is, the photoelectric conversion element 100 may have a configuration in which the positive electrode layer 101, the third layer 106B, the second layer 105, the first layer 104, and the negative electrode layer 102 are arranged in that order, and at least a current path is formed from the positive electrode layer 101 to the negative electrode layer 102.

Furthermore, materials and compositions of the three layers 104 to 106B are determined such that the energy levels in the conduction band (LUMO, excited state) increase in order of the first layer 104, the second layer 105, and the third layer 106B, and the energy level of the second layer 105 in the valence band (HOMO, ground state) is higher than the energy level of the third layer 106B in the valence band. In the conduction band, the energy level of the second layer 105 is higher than the energy level of the first layer 104, and the energy level of the third layer 106B is higher than the energy level of the second layer 105. For example, in the first layer 104, the energy level in the valence band can be set to −8 eV or higher, and the energy level in the conduction band can be set to −4 eV or lower. In this case, in the second layer 105, the energy level in the valence band can be set to −6.0 eV or higher, and the energy level in the conduction band can be set to −3 eV or lower. In addition, in the third layer 106, the energy level in the conduction band is preferably −2 eV or lower.

The third layer 106B may be a thin film that covers a surface (exposed surface) of a molecule of the inorganic perovskite type substance contained in the second layer 105 within a photoelectric conversion element precursor including the first layer 104 and the second layer 105. A molecule of the organometallic complex constituting the third layer 106B is obtained by forming a coordination bond between an inorganic transition metal and an organic ligand. Here, 108A indicates an inorganic transition metal ion of the third layer 106B, and 108B indicates an organic ligand of the third layer 106B.

In the organometallic complex, inorganic transition metal ions 108A may be localized in a film shape on the side of the second layer so that they are directly bonded to the inorganic perovskite type substance of the second layer 105. On the other hand, the organic ligand 108B may be localized in a film shape on the side opposite to the second layer (on the side of the positive electrode). Then, in order to realize amplification of a photocurrent to be described below, molecules of the organometallic complex of the third layer 106B may be bonded to molecules of the inorganic perovskite type substance such that the organic ligand 108B and inorganic transition metal ions 108A are arranged in that order on the current path from the side of the positive electrode layer 101 to the side of the second layer 105. That is, the third layer 106B is divided into a layer formed of inorganic transition metal ions and a layer formed of organic ligand ions. Here, a boundary between the two layers can be confirmed using, for example, a transmission electron microscope (TEM).

Examples of the inorganic transition metal ion here include $Eu^{3+}$, $Cr^{3+}$, and the like where the reduction potential is LUMO, and $Ru^{2+}$, $Fe^{2+}$, $Mn^{2+}$, $Co^{2+}$, and the like where the oxidation potential is HOMO. In addition, examples of the organic ligand here include a ligand of a general metal complex, for example, (i) an organic compound having a carboxyl group, a nitro group, a sulfo group, a phosphate group, a hydroxy group, an oxo group or an amino group; (ii) an ethylenediamine derivative; (iii) a ring heteroatom-containing organic ligand such as a terpyridine derivative, a phenanthroline derivative, or a bipyridine derivative; (iv) an acetylacetonato-based organic ligand (here, "acetylacetonato-based organic ligand" refers to an organic ligand that can form a coordination bond with many transition metal ions through two oxygen atoms (for example, while forming a six-membered ring)) such as a catechol derivative, a quinone derivative, a naphthoic acid derivative, or an acetylacetonato derivative (specifically for example, acetylacetone), and the like.

The thickness of the third layer 106B is preferably, for example, about 1 nm or more and 10 nm or less. If the third layer 106B is thicker than 10 nm, the energy barrier becomes too thick, a sufficient tunneling probability cannot be obtained, and amplification of a photocurrent in the photoelectric conversion layer 103B is hindered. In addition, if the third layer 106B is thinner than 1 nm, light is not emitted, a tunneling current flows even when the band is not bent, and thus the light detection function of the photoelectric conversion layer 103B becomes meaningless.

(Energy Band Structure)

FIGS. 7(a) to 7(d) show structures of energy bands of respective layers during an operation of the photoelectric conversion element 100B according to the present embodiment. Here, 108A indicates an inorganic transition metal ion of the third layer 106B, and 108B indicates an organic ligand of the third layer 106B.

When light is not emitted, the energy level of the third layer 106B in the conduction band is higher than the Fermi level of the positive electrode layer 101 on the side of the positive electrode layer 101, and as shown in FIG. 7(a), a current from the positive electrode layer 101 to the negative electrode layer 102 is blocked.

When light Li having a wavelength of 800 nm or more is emitted to the photoelectric conversion element, the core (the inorganic fine particle 1) of the composite fine particle 10 constituting the second layer 105 absorbs the light and converts the wavelength into a visible light wavelength. The inorganic perovskite type substance absorbs the light whose wavelength has been converted, and generates electrons e and holes h, and the electrons e transition to the conduction band $E_{c2}$ and the holes h transition to the valence band $E_{v2}$ (FIG. 7(b)).

In this case, since the energy levels $E_{c1}$, $E_{c2}$, and $E_{c3}$ of the first layer 104, the second layer 105, and the third layer 106B in the conduction bands have a relationship of $E_{c3}>E_{c2}>E_{c1}$, the electrons e that are generated in the second layer 105 and transitioned to the conduction band of the same layer transition to the conduction band $E_{c1}$ of the first layer 104 which is in a lower energy state.

On the other hand, since the energy levels $E_{v1}$, $E_{v2}$, and $E_{v3}$ of the first layer 104, the second layer 105, and the third layer 106B in the valence bands have relationships of $E_{v2}>E_{v1}$ layer, and $E_{v2}>E_{v3}$, as shown in FIG. 7(c), the holes that are generated in the second layer and transitioned to the valence band are trapped in the valence band of the second layer which is in an energy state higher than (for the holes, lower than) those of the first layer and the third layer.

Due to the effect (positive potential) of the holes that are trapped and distributed in a concentrated manner, in the vicinity of the valence band of the second layer 105, the potential energy of the electrons decreases, and the energy level in the conduction band decreases. Since the energy level in the conduction band significantly decreases toward the second layer 105 in which the holes are trapped, the energy level of the third layer 106B in the conduction band decreases more significantly on the side of the second layer and has a shape in which the side of the positive electrode layer is sharp. Accordingly, for the electrons in the positive electrode layer 101, the energy barrier of the third layer 106 becomes thinner and as shown in FIG. 7(d), and the electrons can be tunneled to the side of the negative electrode layer. That is, when light is emitted to the photoelectric conversion element, a large number of electrons (electrons to which light is not emitted) on the side of the positive electrode that are blocked by the energy barrier of the third layer tunnel (are transmitted) through the thinner energy barrier, and they can flow to the side of the negative electrode. Therefore, the photoelectric conversion element 100B of this modified example can realize significant amplification of a current directly generated with light emitted. Therefore, the photoelectric conversion element 100B of this modified example is suitable for photosensor application.

Here, when the photoelectric conversion elements 100 and 100B of the present disclosure are mounted on a semiconductor substrate such as silicon or a glass substrate, for example, the following device configurations can be used.

(1) a form in which the positive electrode layer 101 having transparency is formed on the uppermost layer most distant from the semiconductor substrate (that is, a configuration in which the (transparent) positive electrode layer 101/the third layer 106/the second layer 105/the first layer 104/the negative electrode layer 102/(Si) substrate are laminated in that order from the uppermost layer on the light incidence side)

(2) a form in which the negative electrode layer 102 having transparency is formed adjacent to the glass substrate (that is, a configuration in which the (glass) substrate/the negative electrode layer 102/the first layer 104/the second layer 105/the third layer 106/the positive electrode layer 101 are laminated in that order from the uppermost layer on the light incidence side)

(3) a form in which the negative electrode layer 102 having transparency is formed on the uppermost layer most distant from the semiconductor substrate (that is, a configuration in which the (transparent) negative electrode layer 102/the first layer 104/the second layer 105/the third layer 106/the positive electrode layer 101/(Si) substrate are laminated in that order from the uppermost layer on the light incidence side)

(Method for Producing Composite Fine Particle)

Next, a method for producing the composite fine particle 10 of the present disclosure will be described. The method for producing the composite fine particle 10 of the present disclosure includes an inorganic fine particle synthesizing step, a first coating layer forming step, a second coating layer forming step, and a third coating layer forming step.

"Inorganic Fine Particle Synthesizing Step"

In the inorganic fine particle synthesizing step, the inorganic fine particles 1 are synthesized. The method for synthesizing the inorganic fine particles 1 is not particularly limited, and examples thereof include a precipitation method, a hydrothermal synthesis method, and the like. For example, a trifluoroacetate or an acetylacetonate is synthesized using Ln (lanthanoid) oxides, for example, $Gd_2O_3$, $Er_2O_3$, $Tm_2O_3$, $Ho_2O_3$, $Yb_2O_3$, $Y_2O_3$, or Ln halides, for example, $ErCl_3$, $ErF_3$, $TmCl_3$, $TmF_3$, $HoCl_3$, $HoF_3$, or the like, as a main raw material. Subsequently, a raw material substance of any one of (i) sodium trifluoroacetate and chain organic molecules or (ii) sulfur (S8) and chain organic molecules is added to the obtained trifluoroacetate salt or acetylacetonate salt, and then the obtained mixture is reacted under high temperature conditions (100 to 400° C.) in a $N_2$ or Ar atmosphere. The solution obtained after the reaction (reactant) is cooled, as necessary, an organic solvent such as ethanol is added thereto, then the resulting mixture is centrifuged using a centrifugal separator to separate the inorganic fine particles 1, and thus the inorganic fine particles 1 are obtained.

"First Coating Layer Forming Step"

In the first coating layer forming step, the first coating layer 2 is formed on the inorganic fine particles 1 obtained in the inorganic fine particle synthesizing step. The method for forming the first coating layer 2 is not particularly limited. Examples thereof include a precipitation method, a hydrothermal synthesis method, and the like. Specifically, trifluoroacetic acid salts are synthesized using lanthanoid oxides $Gd_2O_3$, $Er_2O_3$, $Tm_2O_3$, $Ho_2O_3$, $Yb_2O_3$, and $Nd_2O_3$. The inorganic fine particles 1 and sodium trifluoroacetate are further added thereto, and the mixture is reacted under a nitrogen or argon atmosphere at a high temperature condition (100 to 400° C.). The solution after the reaction is cooled, an organic solvent such as ethanol is added as necessary, and then centrifugation is performed to obtain the inorganic fine particles 1 coated with the first coating layer 2 (first coated particles). The first coating layer may be formed a plurality of times.

"Second Coating Layer Forming Step"

In the second coating layer forming step, the second coating layer 3 is formed on a surface of the first coated particles. The method for forming the second coating layer 3 is not particularly limited. Specifically, for example, a $NaBF_4$ dimethylformamide solution is added dropwise to a solvent in which the first coated particles are dispersed, the mixture is stirred at room temperature (20 to 30° C.) for 30 minutes to 120 minutes under a nitrogen atmosphere, and a powder is obtained by centrifugation. The resulting powder is dispersed in a solvent, a multidentate organic ligand (for example, an indocyanine dye) to which a transition metal ion (for example, $Y^{3+}$, $Pb^{2+}$, or the like) is bonded is added, and the mixture is stirred at room temperature for 10 minutes or more in ultrasound. An organic solvent such as ethanol is added as necessary, and then the mixture is separated by centrifuging to obtain first coated particles coated with the second coating layer (second coated particles).

"Third Coating Layer Forming Step"

In the third coating layer forming step, the third coating layer 4 is formed on a surface of the second coated particles. The method for forming the third coating layer 4 is not particularly limited. Examples of the method for forming the third coating layer 4 include a precipitation method, a hydrothermal synthesis method, and the like. Specifically, for example, the second coated particles are reacted with a solution containing cesium oleate synthesized from cesium carbonate and lead halide ($PbX_2$). The temperature is 120 to 200° C., and the atmosphere is a nitrogen atmosphere. The solution after the reaction is cooled, and fine particles are separated by centrifuging. The separated fine particles are fired (for example, 100° C. to 200° C.) to obtain composite fine particles 10.

(Method for Producing Photoelectric Conversion Element)

FIGS. 8(a) to 8(e) show cross-sectional views of an object to be processed in a process of producing the photoelectric conversion element 100. The photoelectric conversion element 100 can be produced mainly according to the following procedure.

Figure 8A:
FIGS. 8(a)-8(e) show cross-sectional views of an object to be processed in a process of producing the photoelectric conversion element in FIG. 3.

First, as shown in FIG. 8(a), a substrate on which the negative electrode layer 102 is provided for forming the photoelectric conversion layer 103 is prepared. As the negative electrode layer 102 on the substrate, an electrode member that functions as a negative electrode layer and has transparent conductivity is used. Here, the case where the buffer layer 107 is formed on one surface of the negative electrode layer 102 is exemplified, but the buffer layer 107 may not be formed. Here, the buffer layer 107 functions as an electron transport layer or a hole blocking layer. The buffer layer 107 can be formed by applying a material solution to the negative electrode layer 102 using a spin coating method or the like and heating (drying) it. This heating may be performed, for example, at about 120 to 450° C. for about 10 to 60 minutes. Conditions of the material application (application time, and the like) may be adjusted such that the thickness of the buffer layer 107 is, for example, about 1 to 100 nm.

Figure 8B:
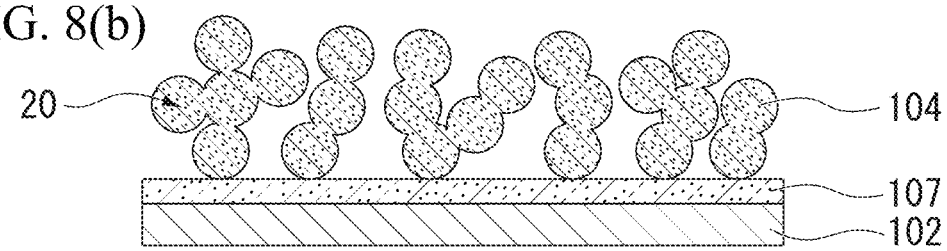

Next, as shown in FIG. 8(b), the first layer 104 composed of a plurality of particles 20 including an inorganic semiconductor as a main component (that is, inorganic semiconductor particles) is formed on one surface side of the negative electrode layer 102 (if the buffer layer 107 is included, with the buffer layer 107 interposed therebetween). As the buffer layer 107, the first layer 104 can also be formed by applying a material solution and heating it. This heating may also be performed, for example, at about 120 to 450° C. for about 10 to 60 minutes. Conditions of the material application (application time, and the like) may be adjusted such that the thickness of the first layer 104 is, for example, about 10 to 1,000 nm, and preferably about 50 to 500 nm.

Figure 8C:
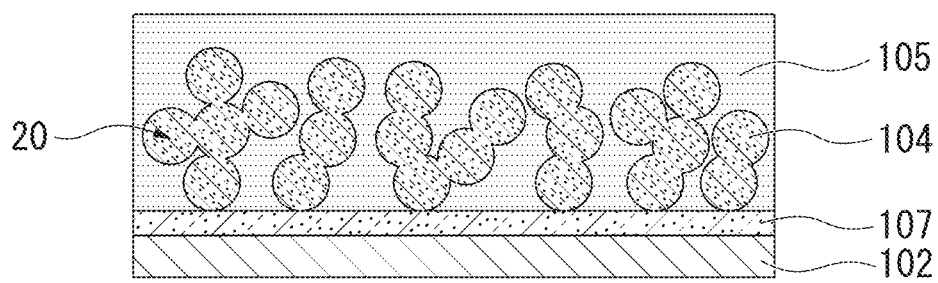

Next, as shown in FIG. 8(c), a solution containing a raw material of an inorganic perovskite type substance as a main component and the composite fine particle 10 may be applied to the surface of the inorganic semiconductor particle 20 using a spin coating method, a dip method or the like, and heated to form the second layer 105. This heating may be performed, for example, at about 40 to 100° C. for about 5 to 10 minutes. The thickness of the second layer 105 is adjusted according to conditions of the material application (application time, and the like).

Figure 8D:
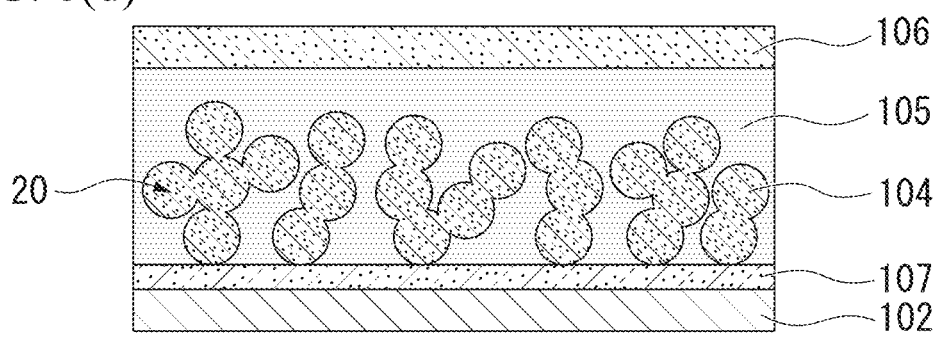

Next, as shown in FIG. 8(d), the third layer 106 may be formed on the second layer 105. More specifically, a material including a p-type organic semiconductor or an inorganic semiconductor as a main component is deposited or a solution containing the material is applied on the second layer 105 using a spin coating method, a dip method or the like, and thus the third layer 106 may be formed. Actually, when the second layer 105 is formed, substantially all the gaps between the inorganic semiconductor particles 20 of the first layer 104 are buried. Therefore, the third layer 106 is formed in a film shape on an exposed portion of the surface of the second layer 105 mainly on the side of the positive electrode layer 101 (the side opposite to the negative electrode layer 102).

When the organometallic complex is formed as the third layer (that is, when the third layer 106B is formed), application and heating of the solution here may be performed in two steps. That is, in the first step, a solution containing an inorganic transition metal such as europium may be applied and heated, and subsequently, in the second step, a solution containing an organic ligand such as terpyridine may be applied and heated. In this manner, as a result of performing formation of the third layer 106B in two steps, the third layer 106B has a structure in which the layer 108A formed of an inorganic transition metal and the layer 108B formed of an organic ligand are laminated in order from the side of the second layer 105.

Figure 8E:
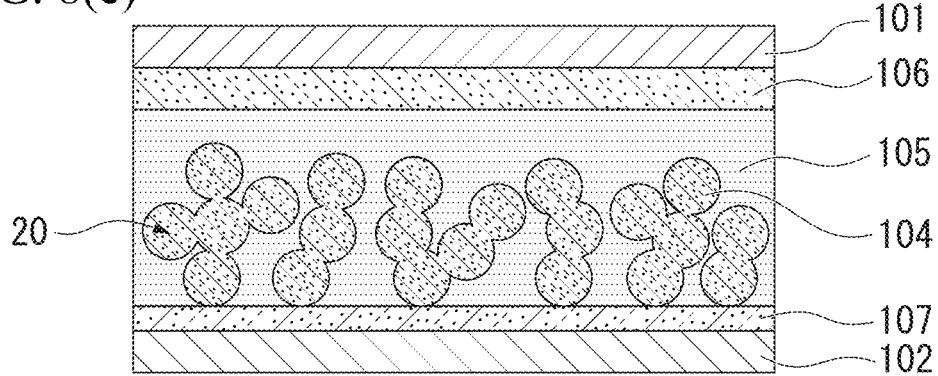

Finally, as shown in FIG. 8(e), when the electrode member (positive electrode layer) 101 that functions as a positive electrode and has conductivity is formed on the third layer 106, the photoelectric conversion element 100 of the present embodiment can be obtained.

In the method for producing the photoelectric conversion element, a case in which the first layer 104 formed of a porous material is used has been described, but the photoelectric conversion element can be produced by the same method as described above even when the first layer 104 is not provided.

As described above, the composite fine particle 10 of the present embodiment has a configuration in which the multidentate organic ligand of the second coating layer 3 converts the absorbed long-wavelength light in a near-infrared or infrared range into short-wavelength light such as visible light and ultraviolet light, and the converted light is re-absorbed by the inorganic perovskite type substance of the second layer 105 and converted into power. Therefore, according to the composite fine particle 10 of the present embodiment, it is possible to generate photoelectric conversion or an electromotive force from long-wavelength light, which has been conventionally difficult.

In addition, the composite fine particle 10 of the present embodiment can suppress thermal vibration of the multidentate organic ligand and can reliably and efficiently perform energy transfer. As a result, it is possible to reduce energy loss. Therefore, even when light to be absorbed by the multidentate organic ligand is weak light, it is possible to realize excellent photosensitizing characteristics.

EXAMPLES

Hereinafter, the effects of the present invention will become more apparent from examples. However, the present invention is not limited to the following examples, but can be appropriately changed and implemented within ranges without changing the gist of the invention.

(1. First Intermediate Particles, Second Intermediate Particles, and Third Intermediate Particles to be Precursor of Composite Fine Particles, and Preparation Thereof)

First, 3 mol of acetylacetone and 1 mol of $LnCl_3 \cdot nH_2O$ were added to water. The obtained mixture was adjusted to pH7 using an aqueous ammonia solution and then stirred to obtain rare earth acetylacetonate hydrate ($Ln(acac)_3 \cdot nH_2O$).

Then, 11 ml of oleylamine, 1.6 ml of oleic acid, and 21 ml of octadecene were added to 383 mg of $Gd(acac)_3 \cdot nH_2O$, 101 mg of $Yb(acac)_3 \cdot nH_2O$, 10 mg of $Er(acac)_3, nH_2O$, 16 mg of sulfur powder S8, and 152 mg of sodium oleate. The resulting mixture was stirred at 120° C. for 20 minutes under vacuum. Thereafter, the temperature was further set to 310° C., and the mixture was stirred for 30 minutes in a $N_2$ atmosphere.

Figure 9B:
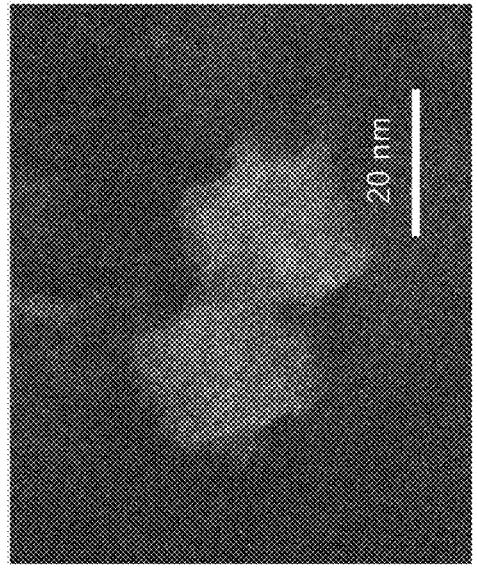
FIGS. 9(a)-9(d) show SEM images of a first intermediate particle, a second intermediate particle, and a third intermediate particle, and an AFM image of a fourth intermediate particle.
Figure 9D:
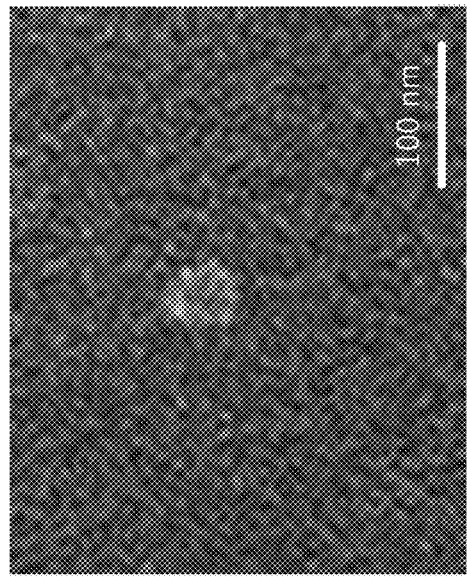
Figure 9A:
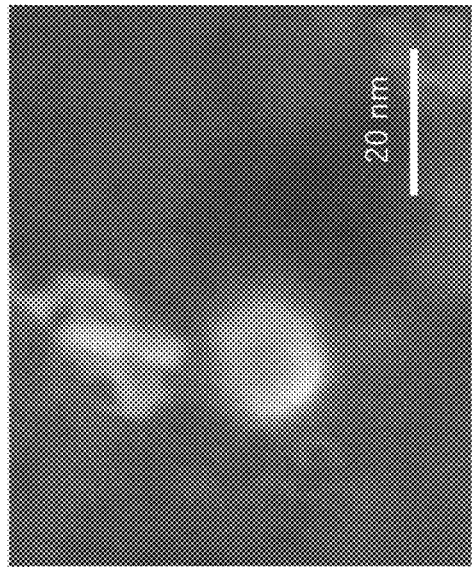

The resulting mixture was cooled to room temperature in a $N_2$ atmosphere, ethanol was added thereto, and then the mixture was centrifuged to obtain first intermediate particles ($Gd_2O_2S$ doped with Er and Yb: Er (5%), Yb (20%), particle size 10 to 20 nm). The particle size of the first intermediate particles was obtained from an observation image (FIG. 9(a)) obtained by SEM observation.

Next, 197 mg of $Yb_2O_3$ was added to 10 mL of a 50% trifluoroacetic acid aqueous solution, and the mixture was stirred at 80° C. for 30 minutes under a reduced pressure. Thereafter, 10 mL of octadecene and 10 mL of oleic acid were further added to 272 g of sodium trifluoroacetate and 205 g of the first intermediate particles obtained above, and the mixture was stirred at 120° C. for 30 minutes under vacuum. Thereafter, the temperature was further set to 320° C., and the mixture was stirred for 30 minutes in a $N_2$ atmosphere. Then, the powder was collected from the resulting mixture by centrifugation to obtain 210 mg of second intermediate particles (first intermediate particles coated with $NaYbF_4$, particle size 25 nm or less). The particle size of the second intermediate particles was obtained from an observation image (FIG. 9(b)) obtained by SEM observation.

Figure 9C:
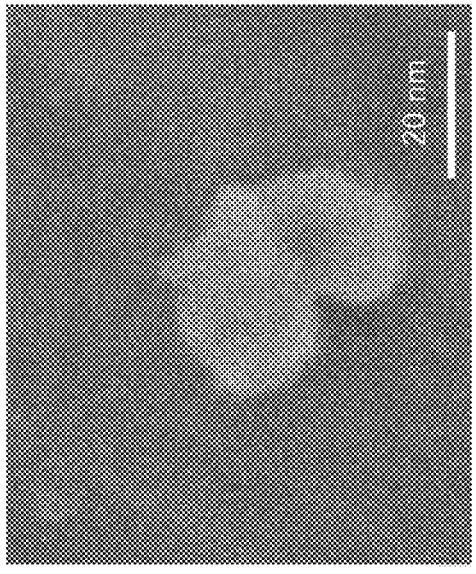

Next, 50 mg of $Nd_2O_3$ and 79 mg of $Y_2O_3$ were added to 10 mL of a 50% trifluoroacetic acid aqueous solution, and the mixture was stirred at 95° C. for 30 minutes under a reduced pressure. Thereafter, 272 mg of sodium trifluoroacetate and 210 mg of the second intermediate particles obtained above were further added, and the mixture was stirred at 120° C. for 30 minutes under vacuum. Thereafter, the temperature was further set to 320° C., and the mixture was stirred for 30 minutes in a $N_2$ atmosphere. Then, the powder was collected from the obtained mixture by centrifugation to obtain 230 mg of third intermediate particles (second intermediate particles coated with $NaYF_4$: 30% Nd, particle size 30 nm or less). The particle size of the third intermediate particles was obtained from an observation image (FIG. 9(c)) obtained by SEM observation.]

(2. Composite Fine Particles a and Production Thereof)

220 mg of the third intermediate particles prepared as described in 1 above were added to 2 mL of hexane, 0.4 mL (concentration 117 g/L) of a $NOBF_4$ dimethylformamide solution was added dropwise thereto, and the obtained mixture after dropwise addition was stirred at room temperature (20 to 30° C.) for 10 minutes. Next, the DMF layer (lower layer) was collected and centrifuged to obtain a powder. The resulting powder was dispersed in hexane and gently dried. The resulting mixture was added to 5 mL of a solution of 1 mg of indocyanine green (ICG) and 0.25 mg of $YCl_3$ in ethanol, and it was stirred at room temperature for 10 minutes in ultrasound. The mixture thus obtained was centrifuged to obtain 170 mg of fourth intermediate particles (third intermediate particles coated with ICG-Y, particle size 40 nm or less, nanoparticles B). The particle size of the fourth intermediate particles was obtained from an observation image (FIG. 9(d)) obtained by SEM observation.

Next, 130 g of $Y_2O_3$ was added to 10 mL of a 50% trifluoroacetic acid aqueous solution, and the mixture was stirred at 80° C. for 30 minutes under a reduced pressure.

Thereafter, 272 g of sodium trifluoroacetate and 170 mg of the fourth intermediate particles obtained above were further added, and the mixture was stirred with nitrogen at 150° C. for 180 minutes. Then, the powder was collected from the resulting mixture by centrifugation to obtain 200 mg of composite fine particles A (fourth intermediate particles coated with $NaYF_4$, particle size 50 nm or less). The particle size of the composite fine particles A was obtained from a SEM image obtained from SEM observation (FIG. 10(a)).

(3. Composite Fine Particles B and Production Thereof)

First, 814 mg of cesium carbonate ($Cs_2CO_3$) was dissolved in 2.5 mL of oleic acid and 40 mL of octadecene, and the resulting mixture was stirred at 120° C. for 60 minutes under a nitrogen atmosphere. A cesium oleate solution was prepared beforehand by further stirring the mixture at 160° C. for 30 minutes.

220 mg of the third intermediate particles prepared as described in 1 above were added to 2 mL of hexane, 0.4 mL (concentration 117 g/L) of a $NOBF_4$ dimethylformamide solution was added dropwise thereto, and the obtained mixture after dropwise addition was stirred at room temperature (20 to 30° C.) for 10 minutes. Next, the DMF layer (lower layer) was collected and centrifuged to obtain a powder. The resulting powder was dispersed in hexane and gently dried. The resulting mixture was added to 5 mL of a solution of 1 mg of indocyanine green (ICG) and 0.5 mg of $PbBr_2$ in ethanol, and it was stirred at room temperature for 10 minutes in ultrasound. The mixture thus obtained was centrifuged to obtain 200 mg of fourth intermediate particles (third intermediate particles coated with ICG-Pb, particle size 40 nm or less).

147 mg of $PbBr_2$ and 200 mg of the fourth intermediate particles obtained above were dispersed in 10 mL of octadecene, and then the resulting dispersion was stirred at 120° C. for 1 hour under a nitrogen atmosphere. Then, 1 mL of oleic acid and 1 mL of oleylamine were added to the resulting mixture, and then the temperature of the resulting mixture was set to 180° C. Then, 0.85 mL of the cesium oleate solution prepared in advance as described above was added thereto, and the mixture was reacted, then cooled immediately. The powder was collected from the mixture by centrifugation to obtain composite fine particles B (particle size 50 nm or less). The particle size of the composite fine particles B was obtained from a SEM image obtained from SEM observation (FIG. 10(b)).

(4. Nanoparticles a (Comparative Fine Particles in which Second Coating Layer is not Present) and Production Thereof)

130 g of $Y_2O_3$ was added to 10 mL of a 50% trifluoroacetic acid aqueous solution to obtain a mixture. The resulting mixture was stirred at 80° C. for 30 minutes under a reduced pressure. Thereafter, 272 g of sodium trifluoroacetate and 170 mg of the third intermediate particles obtained above were further added to the mixture. The resulting mixture was then stirred at 150° C. for 180 minutes under nitrogen. Then, the powder was collected from the resulting mixture by centrifugation to obtain nanoparticles A (comparative fine particles in which the second coating layer is not present).

(5. Photoelectric Conversion Element)

As a member provided on a substrate and serving as a negative electrode layer, a member substantially formed of an antimony-doped tin oxide (ATO) was prepared. One surface of the member was spin-coated with 200 μl of an ethanol solution of 0.18 M titanium diisopropylate diacetylacetonate at a rotational speed of 3,000 rpm. Subsequently, the mixed liquid spin-coated on the member was heated at 500° C. for 30 minutes to form a buffer layer substantially formed of a titanium oxide ($TiO_2$) dense film.

Next, the buffer layer formed as described above was spin-coated with 120 μl of a mixed liquid containing a titanium oxide ($TiO_2$) paste (PST18NR, manufactured by JGC Catalysts and Chemicals Ltd.) and ethanol at a weight ratio of 1:3.5 at a rotational speed of 6,000 rpm. Subsequently, the mixed liquid spin-coated on the buffer layer was heated at 120° C. for 10 minutes and at 450° C. for 1 hour in that order to form a first layer (porous film) composed of a plurality of particles substantially formed of titanium oxide.

Next, with respect to the first layer (porous film) formed as described above, 500 μl of a mixed solution of dimethylformamide (DMF) and dimethyl sulfoxide (DMSO) (DMF:DMSO=3:2) containing 288 mg of lead iodide ($PbI_2$), 163 mg of cesium iodide (CsI) and the composite fine particles B obtained in the above 3 at 8 wt % concentration (w %) were dissolved at a concentration of 1.25 M, and the resulting mixed liquid was stirred at room temperature for 1 hour. 100 μl of the mixed liquid was spin-coated at a rotational speed of 5,000 rpm. Subsequently, the mixed liquid spin-coated on the first layer (porous film) was left standing at room temperature for 10 minutes and then heated at 180° C. for 15 minutes to form a second layer.

Next, to the second layer formed as described above, 36 mg of Spiro-OMeTAD, 14 μl of tertiary-butylpyridine and 8.75 μL of a 1.8 M lithium bis(trifluoromethanesulfonyl)imide (Li-TFSI) acetonitrile solution were mixed, and the resulting mixed liquid was stirred at room temperature for 1 hour, and then 70 μl of the mixed liquid was spin-coated at a rotational speed of 3,000 rpm.

Finally, a positive electrode layer (Au) was formed (deposited) to be in contact with the third layer and on the side opposite to the negative electrode layer with a laminate including the first layer, the second layer, and the third layer therebetween, and thereby a photoelectric conversion element was produced.

(6. Light Emission Spectrum of Composite Fine Particles)

The spectrum when near-infrared light having a wavelength of 700 nm or more was emitted to the composite fine particles A obtained in the above 2 was measured with an absolute PL quantum yield measurement device manufactured by Hamamatsu Photonics K.K.

(Light Absorption Spectrum of Composite Fine Particles)

Light absorption spectra of the composite fine particles A obtained in the above 2 and the nanoparticles A (comparative fine particles in which the second coating layer is not present) were measured with an absolute PL quantum yield measuring device manufactured by Hamamatsu Photonics K.K.

(7. Current-Voltage Characteristics of Photoelectric Conversion Element)

The current-voltage characteristics of the photoelectric conversion element produced in the above 5 were measured. The wavelength of the irradiated light was 750 nm or more, and the irradiance was 1 sun.

Figure 11:
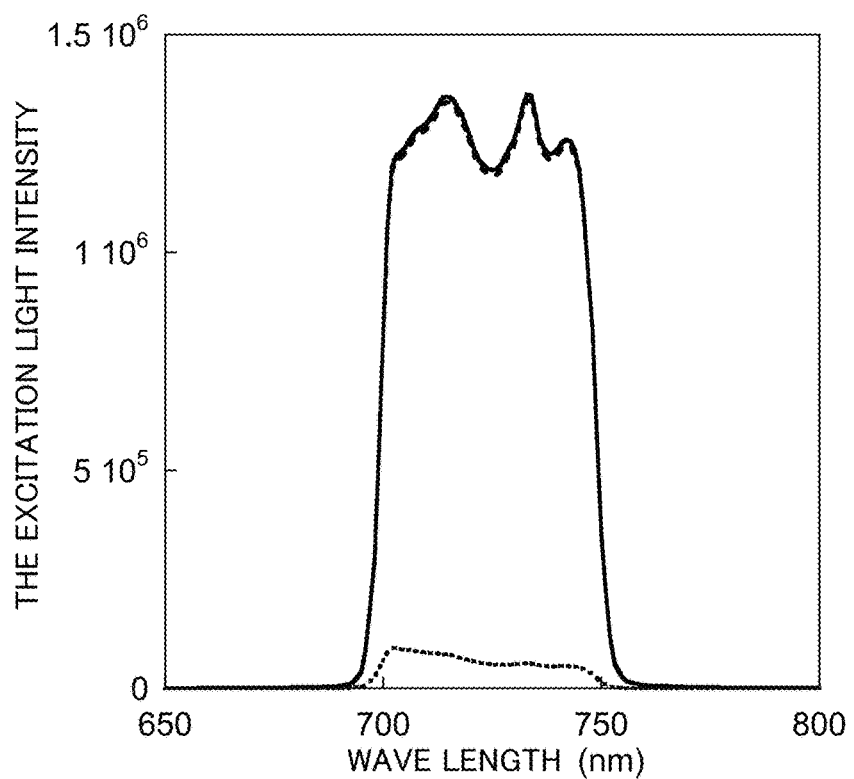
FIG. 11 is a graph showing changes in absorption rates of excitation light with which composite fine particles A and nanoparticles A (comparative fine particle in which the second coating layer is not present) are irradiated.

FIG. 11 is a graph showing changes in absorption rates of excitation light. The horizontal axis in FIG. 11 represents wavelength (nm), and the vertical axis in FIG. 11 represents intensity (Counts/s). A solid line in FIG. 11 indicates the intensity of the original excitation light, and a dotted line in FIG. 11 indicates the intensity after the composite fine particles A obtained in the above 2 are irradiated with excitation light. From the results of FIG. 11, it was confirmed that the composite fine particles A obtained in the above 2 efficiently absorbed light of 700 nm or more. The broken line in FIG. 11 shows the result of the nanoparticles A prepared by the same method as that of the composite fine particles A except that the second coating layer (infrared absorption dye) is not formed. When the second coating layer was not provided, it was confirmed that light of 700 nm or more was hardly absorbed. Also, in the composite fine particles B obtained in the above 3, the same results as described above were obtained.

Figure 12:
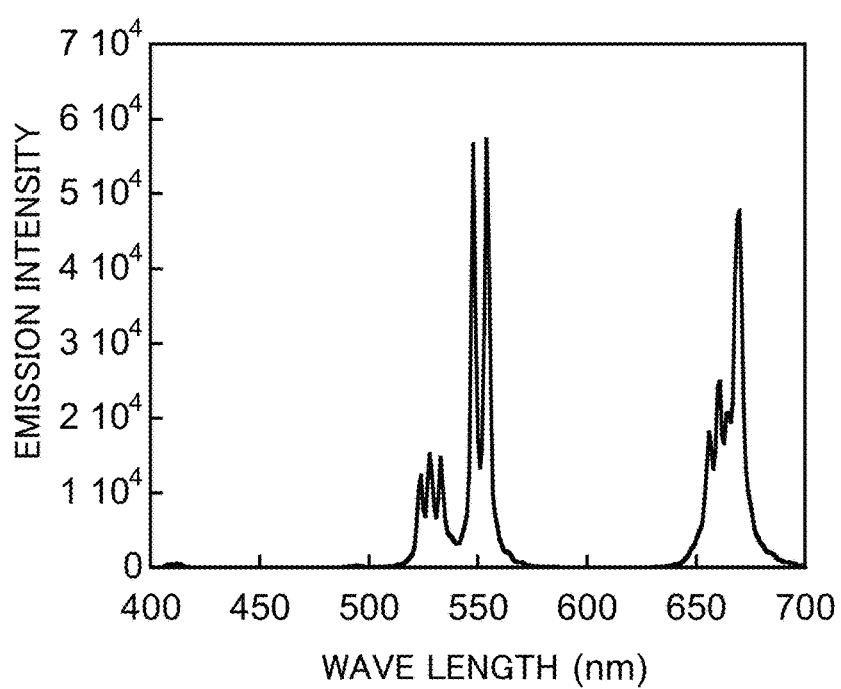
FIG. 12 is a graph showing a light emission spectrum of composite fine particles A.

FIG. 12 is a graph showing a spectrum of light whose wavelength has been converted when the excitation light shown in FIG. 11 was emitted to the composite fine particles A obtained in the above 2. The horizontal axis in FIG. 12 represents wavelength (nm), and the vertical axis in FIG. 12 represents intensity (Counts/s). Peaks are shown at three wavelengths (around about 530 nm, around about 550 nm, around about 680 nm). From the results of FIGS. 11 and 12, it can be understood that the emitted light having a wavelength of 700 nm or more was converted into these three light beams. The internal emission quantum yield (visible light range) of the composite fine particles A obtained in the above 2 by near-infrared light excitation was 5.98%.

Figure 13:
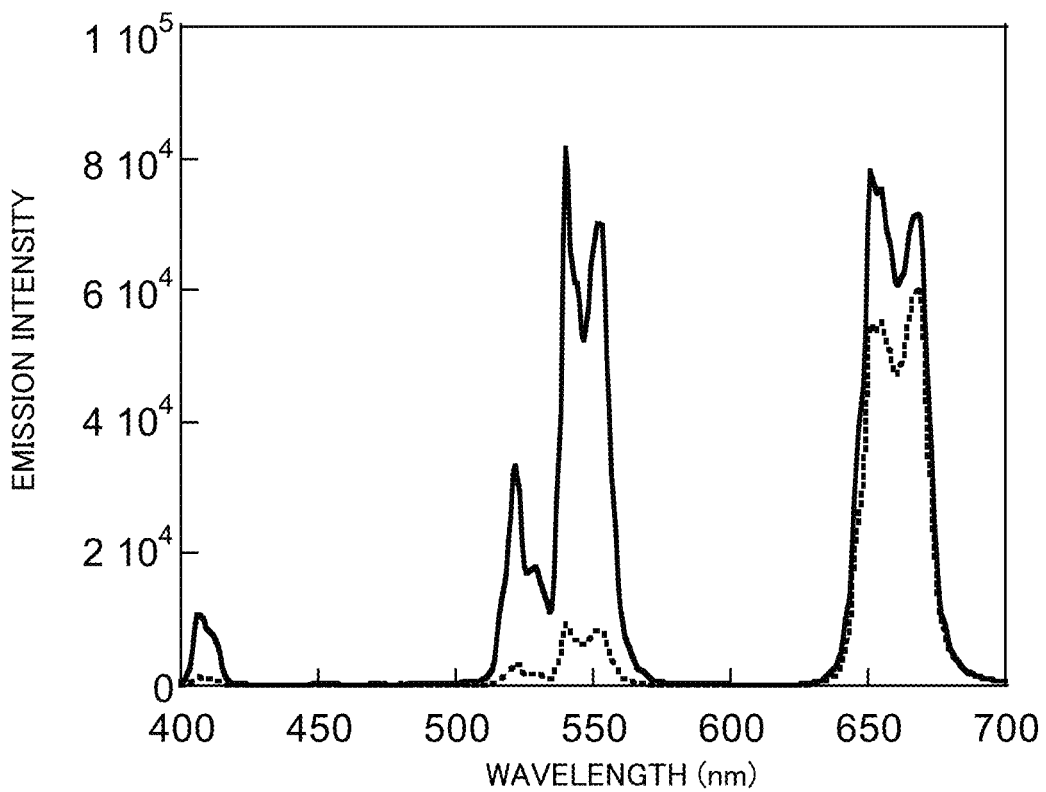
FIG. 13 is a graph showing light emission spectrums of composite fine particles B.

FIG. 13 is a graph showing a spectrum of light whose wavelength has been converted when the excitation light shown in FIG. 11 was emitted to the composite fine particles B obtained in the above 3. The horizontal axis in FIG. 13 represents wavelength (nm), and the vertical axis in FIG. 13 represents intensity (Counts/s). Peaks are shown at four wavelengths (around about 405 nm, around 520 nm, around about 550 nm, around about 680 nm). From the results of FIGS. 11 and 13, it can be understood that the emitted light having a wavelength of 700 nm or more was converted into these four light beams. The internal emission quantum yield (visible light range) of the composite fine particles B obtained in the above 3 by near-infrared light excitation was 6.12%. A dotted line in FIG. 13 is the result of the fourth intermediate particles (third intermediate particles coated with ICG-Y, nanoparticles B) in which the third coating layer is not present. When the third coating layer was not provided (nanoparticles B), the emission intensities around about 405 nm, around 520 nm, and around about 550 nm among the four wavelengths decreased, and the internal emission quantum yield (visible light range) was 2.54%. This is presumed to be because energy deactivation is likely to occur since the nanoparticles B do not have the third coating layer. Since the nanoparticles B do not have the third coating layer, a decrease in emission intensity (efficiency) and a decrease in up-conversion intensity (up-conversion is less likely to occur, and only light emission on the long wavelength side is observed) occur.

Figure 14:
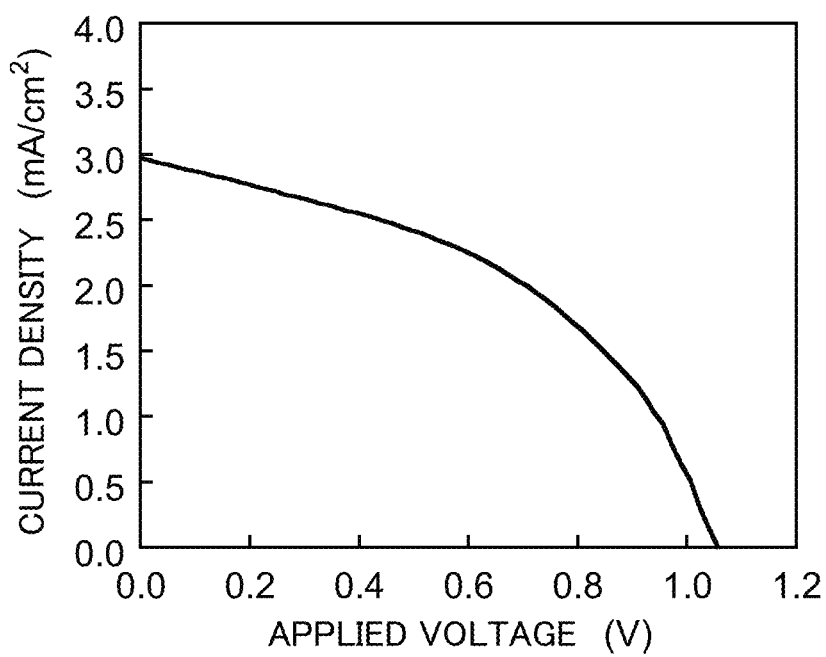
FIG. 14 is a graph showing current-voltage characteristics of the photoelectric conversion element of Example 1.

FIG. 14 is a diagram showing current-voltage characteristics of the photoelectric conversion element produced in the above 5. In FIG. 14, the horizontal axis represents voltage (V), and the vertical axis represents current density (mA/cm$^2$). As shown in FIG. 14, it can be understood that the photoelectric conversion element produced in the above 5 generates power by irradiation with light having a wavelength of 750 nm or more. This is considered to be because the inorganic perovskite type substance absorbed the light whose wavelength had been efficiently converted by the composite fine particles B obtained in the above 3. The fill factor ff determined from the open circuit voltage of 1.06 V and the short circuit current of 2.47 mA/cm$^2$ for the photoelectric conversion element produced in the above 5 was 0.45. From the above, it can be understood that by using the composite fine particles and the photoelectric conversion element of the present invention, excellent detection sensitivity can be obtained for light in the near-infrared or infrared range.

REFERENCE SIGNS LIST

1 Inorganic fine particle
2 First coating layer
3 Second coating layer
4 Third coating layer
10 Composite fine particle
100 Photoelectric conversion element
101 Positive electrode layer
102 Negative electrode layer
103 Photoelectric conversion layer
104 First layer
105 Second layer
106 Third layer
107 Buffer layer

What is claimed is:

1. A composite fine particle, comprising:
   an inorganic fine particle having a light wavelength conversion ability;
   a continuous or discontinuous first coating layer formed on the whole or a part of a surface of the inorganic fine particle;
   a second coating layer formed on the first coating layer; and
   a third coating layer formed on the second coating layer, wherein
   the second coating layer contains a multidentate organic ligand that is an organic compound having light absorption in a near-infrared or infrared range and has at least two or more coordination sites, and
   the first coating layer is a metal layer or an inorganic compound layer containing a coordination metal capable of forming a coordination bond with the multidentate organic ligand and a transition metal identical to or different from the coordination metal, and
   the third coating layer is a metal layer or an inorganic compound layer containing a coordination metal capable of forming a coordination bond with the multidentate organic ligand.

2. The composite fine particle according to claim 1, wherein the inorganic fine particle contains a metal that is a rare earth element capable of emitting excitation light in a visible or ultraviolet range.

3. The composite fine particle according to claim 2, wherein the multidentate organic ligand transfers energy generated by light absorption in the near-infrared range or infrared range, by forming a coordination bond with the coordination metal contained in the first coating layer, from the coordination metal contained in the first coating layer to the metal that is a rare earth element capable of emitting excitation light in the visible or the ultraviolet range contained in the inorganic fine particle via the transition metal contained in the first coating layer, whereby wavelength conversion light emission by the inorganic fine particle becomes possible.

4. The composite fine particle according to claim 1, wherein the transition metal contained in the first coating layer is a lanthanoid metal.

5. The composite fine particle according to claim 1, wherein the third coating layer is an inorganic compound layer formed of an inorganic perovskite type substance.

6. The composite fine particle according to claim 1, wherein the first coating layer is a multilayer including a metal layer or an inorganic compound layer containing the coordination metal and a metal layer or an inorganic compound layer containing a transition metal identical to or different from the coordination metal.

7. The composite fine particle according to claim 1, having a substantially spherical or polygonal parallelepiped shape and having an average particle size of 1 nm or more and 1 μm or less.

8. A solar cell comprising a photoelectric conversion layer containing the composite fine particle according to claim 1, and an inorganic perovskite type substance.

9. The solar cell according to claim 8, further comprising an electron transport layer made of titanium(IV) oxide.

10. A member for a photoelectric conversion element, in which
- a layer containing the composite fine particle according to claim 1, and
- a layer formed of an aggregate or a thin film containing an organic semiconductor or an inorganic semiconductor as a main component are laminated.

11. A photoelectric conversion element, comprising:
- the member for a photoelectric conversion element according to claim 10;
- a hole transport layer; and
- an electron transport layer, wherein
- the member for a photoelectric conversion element is disposed between the hole transport layer and the electron transport layer.

* * * * *